United States Patent
Sugawara et al.

(10) Patent No.: US 6,713,343 B2
(45) Date of Patent: Mar. 30, 2004

(54) METHOD OF FORMING A SEMICONDUCTOR DEVICE WITH A CAPACITOR INCLUDING A POLYCRYSTALLINE TANTALUM OXIDE FILM DIELECTRIC

(75) Inventors: Yasuhiro Sugawara, Sendai (JP); Shinpei Iijima, Akishima (JP); Yuzuru Oji, Hinode (JP); Naruhiko Nakanishi, Hachioji (JP); Misuzu Kanai, Higashiyamato (JP); Masahiko Hiratani, Akishima (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/388,618

(22) Filed: Mar. 17, 2003

(65) Prior Publication Data

US 2003/0162357 A1 Aug. 28, 2003

Related U.S. Application Data

(62) Division of application No. 09/720,002, filed on Dec. 19, 2000, now Pat. No. 6,544,834.

(30) Foreign Application Priority Data

Jun. 19, 1998 (JP) .......................................... 10-173608

(51) Int. Cl.[7] ...................... H01L 21/8242; H01L 21/20; H01L 21/4763; H01L 21/44
(52) U.S. Cl. ...................... 438/239; 438/240; 438/253; 438/396; 438/649; 438/667
(58) Field of Search .................................. 438/239, 240, 438/253, 396, 649, 667

(56) References Cited

U.S. PATENT DOCUMENTS 5,581,125 A * 12/1996 Maeda ........................ 257/767
5,985,730 A * 11/1999 Lim ............................ 438/393
6,078,493 A    6/2000 Kang
6,091,099 A    7/2000 Kiyotoshi et al.

FOREIGN PATENT DOCUMENTS

| JP | 8-330540 | 12/1996 |
|---|---|---|
| JP | 9-92795 | 4/1997 |
| JP | 10-17395 | 1/1998 |
| JP | 10-84086 | 3/1998 |
| JP | 10-135419 | 5/1998 |
| JP | 10-144884 | 5/1998 |

OTHER PUBLICATIONS

Stanley Wolf Ph.D. in *Silicon Processing for the VI SI Era*, vol. 2: Process Integration, Lattice Press, 1990, pp. 144–147.
Extended Abstract of the 1993 International Conference on Solid State Devices and Materials. Makuhari, 1993, pp. 853–855 "Optimum Electrode Materials for Ta2O5 Capacitor Process Technology by Using O2–Plas. a Annealing Below 400° C".

(List continued on next page.)

Primary Examiner—Olik Chaudhuri
Assistant Examiner—William M. Brewster
(74) *Attorney, Agent, or Firm*—Antonelli, Terry, Stout & Kraus, LLP

(57) ABSTRACT

An integrated semiconductor device has an improved reliability and is adapted to a higher degree of integration without reducing the accumulated electric charge of each information storage capacity element. The semiconductor device is provided with a DRAM having memory cells, each comprising an information storage capacity element C connected in series to a memory cell selection MISFET Qs formed on a main surface of a semiconductor substrate 1 and having a lower electrode 54, a capacity insulating film 58 and an upper electrode 59. The lower electrode 54 is made of ruthenium film oriented in a particular plane bearing, e.g., a (002) plane, and the capacity insulating film 58 is made of a polycrystalline tantalum film obtained by thermally treating an amorphous tantalum oxide film containing crystal of tantalum oxide in an as-deposited state for crystallization.

28 Claims, 39 Drawing Sheets

OTHER PUBLICATIONS

Conduction Mechanism of Thin Oxide–Nitride–Oxide Films under Electric Field Concentration Yamaguchi University, H. Fujiwara, N. Matuso, T. Miyoshi, and K. Wada pp. 1–6; 27 p–N–6.

Aoyama et al., "Leakage Current Mechanism of Amorphous and Polycrystalline $Ta_2O_5$ Films Grown by Chemical Vapor Deposition", J. Electrochemical Society, vol. 143, No. 3, Mar. 1996, pp. 977–983.

* cited by examiner

METHOD OF FORMING A SEMICONDUCTOR DEVICE WITH A CAPACITOR INCLUDING A POLYCRYSTALLINE TANTALUM OXIDE FILM DIELECTRIC

CROSS-REFERENCE OF RELATED APPLICATIONS

This application is a Divisional application of Application Ser. No. 09/720,002, filed Dec. 19, 2000 now U.S. Pat. No. 6,544,834, the contents of which are incorporated herein by reference in their entirety. No. 09/720,002 is a National stage application, filed under 35 U.S.C. §371, of International Application No. PCT/JP99/03177, filed Nov. 19, 1999.

TECHNICAL FIELD

The present invention relates to a semiconductor device and a technique for manufacturing such device, and, more particularly, to a technique that is effectively applied to a semiconductor device having a DRAM (Dynamic Random Access Memory).

BACKGROUND OF ART

A plurality of word lines and a plurality of bit lines are arranged in a matrix shape on a main surface of a semiconductor substrate. Memory cells of a DRAM are located at respective intersections where both lines meet. Each of the memory cells comprises a memory cell selection MISFET (Metal Insulator Semiconductor Field Effect Transistor) and an information storage capacity element (capacitor) connected thereto in a series. The memory cell selection MISFET is formed in an active region surrounded by an element isolation region. The memory cell selection MISFET mainly comprises a gate oxide film, a gate electrode integrally formed with a word line, and a pair of semiconductor regions having a source and a drain. The bit lines are arranged above the memory cell selection MISFETs, respectively, and electrically connected to one of the source and the drain that are shared with two adjacent memory cell selection MISFETs in a direction extended along the bit lines. The information storage capacity element is also located above the memory cell selection MISFET and electrically connected to the other of the source and the drain.

Japanese Patent Application Laid-open No. 7-7084 discloses a DRAM having a Capacitor Over Bitline structure where an information storage capacity element is arranged above a bit line. In such disclosed DRAM, in order to compensate for a decreasing amount of storage electric charge (Cs) of the information storage capacity element due to fineness of the memory cell, an surface area thereof is increased by forming, in a cylindrical shape, a lower electrode (a storage electrode) of the information storage capacity element located above the bit line, and a capacity insulation film and an upper electrode (a plate electrode) are formed thereabove. As the capacity insulation film, a stack insulation film formed by both silicon oxide film and silicon nitride film is used.

However, as the DRAM develops in both high integration and fineness, the surface area of the lower electrode is reduced. Therefore, the capacity insulation film comprising the stack insulation film formed by both silicon oxide and silicon nitride films, has difficulty securing enough amount of storage electric charge. Meanwhile, if film thickness of the capacity insulation film is reduced to secure enough amount of storage electric charge, leak current between the upper electrode and the lower electrode is increased so that refresh characteristics (reliability) of the DRAM is increased. Accordingly, means are needed in which a necessary amount of the storage electric charge is secured even in a capacity insulation film having enough film thickness to restrict generation of the leak current, and various methods for performing the means are proposed.

One of the methods is a method for using the capacity insulation film made of a highly dielectric or ferroelectric material, thinning the film thickness of the capacity insulation film effective in case where the capacity insulation film is converted into the silicon oxide film, and securing enough capacity value. A tantalum oxide film is typically used as such an insulating film. Technologies for using the tantalum oxide film as a capacity insulating film are described in pages 853–855 and 862–864 of "Extended Abstracts of the 1993 International Conference on Solid State Device and Materials, Makuhari", or in page 728 of "Abstracts of the 43rd Associated Exhibition for Applied Physics", or the like.

Further, since tantalum oxide film is generally formed by means of CVD method using organic tantalum gas, it is difficult to form the tantalum oxide film by deposition at high temperature. Therefore, the tantalum oxide film being in an as-deposited state is in an amorphous state, so that it is necessary to crystallize it after being treated thermally in order to obtain a capacity insulation film having a high permittivity. On the other hand, methods have been proposed which reform the tantalum oxide film by heat or plasma treatment under an oxidizing atmosphere of about 400° C. for avoiding heat treatment under high temperature.

However, the tantalum oxide film reformed by heat or plasma treatment is not crystallized and remains in an amorphous state. If being used as a capacity insulating film, the amorphous tantalum oxide film can not have a high permittivity. And, non-crystallized tantalum oxide film is degraded in film quality by heat treatment (performed, for example, at between 400 and 600° C.) or the like for obtaining electrical conduction of connecting portions between distributing wires provided after an information storage capacity element is formed and another distributing wires or substrate provided below the distributing wires. Therefore there is the drawback that reliability of the DRAM is decreased because of, for example, increase of leak current generated in the capacity insulation film or the like.

On the other hand, the tantalum oxide film being in an amorphous state requires heat treatment at more than 750° C. for crystallization thereof if an underlying layer thereof is made of silicon, oxide or nitride of the silicon, or the like. While the crystallized tantalum oxide film does not give rise to any degradation in film quality if being subjected to heat treatment thereafter, the following problems arise when the DRAM has a COB structure.

In the DRAM having the COB structure, before an information storage capacity element is formed, bit lines are provided together with first distributing wires layer in a peripheral circuit formed on the same layer that the bit lines are arranged on. A connecting part between the first distributing wires layer in this peripheral circuit region and the semiconductor substrate is normally provided with a metal silicide film in order to reduce a connecting resistance. If the DRAM having such structure is heat-treated at more than 750° C. as described above, the metal silicide film of said connecting part is affected by the heat treatment to raise the connecting resistance. Thereby, in the worst case, there is a problem of destruction of the metal silicide film.

Additionally, whether being crystallized or not, the tantalum oxide film has to be treated in an oxidizing atmosphere. Oxidization of the underlying substrate under such oxidation treatment causes the following problems. That is, if lower electrodes which are underlying are made of silicon, silicon oxide film is formed between the lower electrodes and the tantalum oxide film, film thickness of capacity insulation film is effectively increased because of insulator films having lower permittivity in the tantalum oxide film. Thereby, the capacity insulation element can not have enough capacitance value to be desired. On the other hand, if the lower electrodes which are underlying are made of metal such as titanium nitride, tungsten or the like, a case where the oxide is an insulator film causes increase of the capacity insulator film in film thickness as described above, too. Or, a case where the oxide is formed by electric conductor materials causes cubic expansion due to formation of the metal oxide, and increases leak current in the tantalum oxide film because of stress influencing the tantalum oxide film.

An object of the present invention is to provide a capacity insulation film that has both high heat resistance and reliability and that can increase an amount of storage electric charge thereof.

And, an object of the present invention is to provide a technique for crystallizing the tantalum oxide film by heat treatment at low temperature, without degrading the metal silicide film of the connecting part for distributing wires.

And, an object of the present invention is to provide a technique for suppressing oxidation of the underlying substrate when the tantalum oxide film is crystallized.

And, an object of the present invention is to provide a technique for processing a DRAM that suppresses increase of the connecting resistance to the connecting part in the peripheral circuit region, and that has a capacity insulation element therein with high permittivity, thereby being capable of obtaining high integration, performance and reliability.

Above-mentioned and other objects and novel features of the present invention will become clear through the following description which is made by referring to the accompanying drawings.

DISCLOSURE OF THE INVENTION

Among embodiments of invention disclosed by the present application, summaries of several representative embodiments will briefly described below.

(1) A semiconductor device of the present invention comprises: a substrate of a semiconductor or a substrate having a semiconductor layer as a surface thereof; a memory cell selection MISFET formed on a main surface of the substrate; and an information storage capacity element having a first electrode, a second electrode and a capacity insulating film, the first electrode being electrically connected to a semiconductor region functioning as source or drain of the memory cell selection MISFET, the second electrode being formed opposite to the first electrode, the capacity insulating film being put between the first and second electrodes wherein the first electrode includes a metal or a crystal film of an oxide thereof or a crystal film of nitride thereof which are oriented in a particular plane bearing.

With such a semiconductor device, since the first electrode has a crystal film of metal or oxide of nitride thereof oriented in a particular plane bearing on the surface, an amorphous film containing crystal in an as-deposited state is formed in the capacity insulating film that is formed on the crystal film. Then, temperature of the heat treatment can be lowered to suppress the possible thermal degradation of the members that are prepared in advance.

(2) And, a semiconductor device of the present invention comprises: a substrate of a semiconductor or a substrate having a semiconductor layer as a surface thereof; a memory cell selection MISFET formed on a main surface of the substrate; and an information storage capacity element having a first electrode, a second electrode and a capacity insulating film, the first electrode being electrically connected to a semiconductor region functioning as source or drain of the memory cell selection MISFET, the second electrode being formed opposite to the first electrode, the capacity insulating film being put between the first and second electrodes wherein the first electrode includes a metal oxide film having an rugged surface.

With such a semiconductor device, since the surface of the first electrode has an enlarged area, the accumulated electric charge of the information storage capacity element can be increased.

A metal film containing a crystal oriented in a particular plane bearing may be formed on a surface of the metal oxide film of the first electrode. Then, as in the case of (1) above, temperature of the heat treatment can be lowered to suppress the possible thermal degradation of the members that are prepared in advance.

In the semiconductor device according to (1) or (2) above, the metal element contained in the first electrode may be ruthenium (Ru), tungsten (W), iridium (Ir) or platinum (Pt).

The capacity insulating film may be a metal oxide film having a crystal structure. A typical example of the metal oxide film is a polycrystalline tantalum oxide film.

The crystal of the metal oxide film or the tantalum oxide film may be oriented in a plane bearing same as the crystal contained in the first electrode. Both the crystal contained in the first electrode and the crystal contained in the capacity insulating film may have a crystal structure of hexagonal system and be oriented in a (002) plane.

In the semiconductor device according to (1) or (2) above, the second electrode may be made of metal or metal oxide. Examples of materials that can be used for the second electrode include a tantalum nitride (TiN) film, a ruthenium oxide (RuO) film, a ruthenium (Ru) film and a tungsten (W) film.

In the semiconductor device according to (1) or (2) above, a film of oxide of the metal element contained in the first electrode may be formed on the interface of the first electrode and the capacity insulating film and the oxide film may have electrical conductivity. Examples of oxide film of the metal element contained in the first electrode include ruthenium oxide (RuO) film and iridium oxide (IrO) film.

In the semiconductor device according to (1) or (2) above, the plug for connecting the first electrode and the semiconductor region may be made of metal or a metal compound and an anti-reaction film may be formed between the plug and the first electrode.

In the semiconductor device according to (1) or (2) above, the connecting portions for connecting the wires underlying the information storage capacity element and the main surface of the substrate may be made of metal or a metal compound and a metal silicide film may be formed on the main surface of the substrate carrying the connecting portions.

(3) A process of manufacturing a semiconductor device according to the present invention including: a substrate of a semiconductor or a substrate having a semiconductor layer as a surface thereof; a memory cell selection MISFET formed on a main surface of the substrate; and an information storage capacity element having a first electrode, a second electrode and a capacity insulating film, the first electrode being electrically connected to a semiconductor region functioning as source or drain of the memory cell selection MISFET, the second electrode being formed opposite to the first electrode, the capacity insulating film being put between the first and second electrodes, the process comprises: (a) a step of depositing an electrically conductive metal film of metal or an electrically conductive oxide or an electrically conductive nitride by one of a sputtering and a CVD method and forming the first electrode by processing the metal film or the oxide film or the nitride film; (b) a step of depositing an insulating metal oxide film on the first electrode by the CVD method; and (c) a step of forming the capacity insulating film by heat-treating the metal oxide film under 700° C. to make grow a crystal of the metal oxide.

Examples of metal element contained in the film of metal or oxide or nitride thereof formed by deposition in step (a) above include ruthenium (Ru), tungsten (W), iridium (Ir) or platinum (Pt).

The rate of forming the film of metal or oxide or nitride thereof by deposition in step (a) above may be less than 200 nm/min.

The film of metal or oxide or nitride thereof formed by deposition in step (a) above may contain crystal oriented in a particular plane bearing. The plane bearing may be a (002).

(4) A process of manufacturing a semiconductor device accroding to the present invention including: a substrate of a semiconductor or a substrate having a semiconductor layer as a surface thereof; a memory cell selection MISFET formed on a main surface of the substrate; and an information storage capacity element having a first electrode, a second electrode and a capacity insulating film, the first electrode being electrically connected to a semiconductor region functioning as source or drain of the memory cell selection MISFET, the second electrode being formed opposite to the first electrode, the capacity insulating film being put between the first and second electrodes, the process comprises: (d) a step of forming the first electrode by one of a performance of deposition and process of an electrically conductive metal film and then oxidization of the metal film to produce ruggedness, and a performance of deposition of electrically conductive metal film, oxidization of the deposited metal film to produce ruggedness and then process of the metal film; (e) a step of depositing an insulating metal oxide film on the first electrode by the CVD method; and (f) a step of forming the capacity insulating film by heat-treating the metal oxide film under 700° C. to grow a crystal of the metal oxide.

Examples of metal film that can be deposited in step (d) include a ruthenium (Ru) film, a tungsten (W) film, an iridium (Ir) film or a platinum (Pt) film.

The step (d) of producing ruggedness by oxidation may be a step of heat treatment conducted at temperature of lower than 700° C. in an oxidizing atmosphere or that of plasma processing conducted at temperature of lower than 500° C. in an oxidizing atmosphere and the gas of the oxidizing atmosphere may be oxygen ($O_2$) gas, dinitrogen oxide ($N_2O$) gas or nitrogen monoxide (NO) gas.

The first electrode may be formed by oxidizing part of the metal film and removing part or all of the unchanged (oxidized) region of the metal film by the etching method utilizing the difference of etching rate between the oxidized region and the unchanged region.

Prior to step (e), a film of metal same as the one contained in the first electrode may be formed selectively on the surface of the first electrode by the CVD method and the metal film may contain crystal oriented in a particular plane bearing. The plane bearing may be a (002).

In the manufacturing method according to (3) or (4) above, the metal oxide film deposited in step (b) or step (e), may be a tantalum oxide film. The tantalum oxide film may be formed by the deposition method using pentaetoxytantalum gas as source gas and the CVD method conducted in a temperature range between 450 and 500° C. The tantalum oxide film may be an amorphous tantalum oxide film containing crystal of tantalum oxide therein.

In the manufacturing method according to (3) or (4) above, the heat treatment in one of the step (c) and the step (f) is conducted in one of: the first condition that temperature in an oxygen ($O_2$) atmosphere is lower than 700° C.; the second condition that temperature in an ozone ($O_3$) atmosphere is lower than 600° C.; the third condition that temperature in an dinitrogen oxide ($N_2O$) gas atmosphere is between 600 and 650° C.; the fourth condition that the second treatment that temperature in an atmosphere containing at least ozone is less than 600° C. is conducted, after the first temperature that temperature in an non-oxidizing atmosphere is less than 700° C.; and the fifth condition that the first treatment is conducted after the second treatment.

As a result of the heat treatment, crystal of the tantalum oxide film can be made to grow along the plane bearing of the underlying crystal.

The manufacturing method according to (3) or (4) above may further comprise a step of forming a connecting portion for connecting the distributing wires formed on the insulating film covering the memory cell selection MISFET, to the main surface of the substrate prior to the step (a) or the step (d) wherein a plurality of metal films constituting the connecting portion are piled up, and a metal silicide film is formed on the main surface of the substrate in the connecting portion after the heat treatment between silicon constituting the substrate and the metal element constituting the metal film contacting to the substrate in the piled metal film.

Furthermore, the present invention will be reiterated below.

1. A semiconductor device comprises: a semiconductor substrate having a main surface; a first MISFET having a gate electrode formed on the main surface of the semiconductor substrate and source and drain regions formed at both ends of the gate electrode; a first insulating film formed on the first MISFET; a second insulating film formed on the first insulating film and having a through hole for exposing a surface of the first insulating film; and a capacity element having a first electrode formed on both an inner wall of the through hole and a surface of the first insulating film present in the through hole and electrically connected to the source region or the drain region of the first MISFET, a dielectric film formed on the surface of the first electrode, and a second electrode formed on a surface of the dielectric film wherein the first electrode is made of a metal film oriented in a (002) plane.

2. The semiconductor device according to item 1, wherein the first electrode is made of ruthenium.

3. The semiconductor device according to item 2, wherein the dielectric film is made of a tantalum oxide film oriented in a (002) plane.

4. The semiconductor device according to item 3 further comprises: a second MISFET having a gate electrode formed on the main surface of the semiconductor substrate and a source region and a drain region formed at both ends of the gate electrode; and a silicide layer of a metal film with high melting point, the silicide film being formed on each surface of the source and drain regions wherein the silicide layer being formed under the first insulating film.

5. A process of manufacturing a semiconductor device comprises:
   (a) a step of forming a first insulating film on a main surface of a semiconductor substrate; (b) a step of forming a second insulating film greater than the first insulating film in film thickness on the first insulating film; (c) a step of forming a through hole in the second insulating film for exposing a surface of the first insulating film; (d) a step of forming a ruthenium film oriented in a (002) plane on an inner wall of the through hole and the surface of the first insulating film in the through hole; (e) a step of depositing a tantalum oxide film on the ruthenium film; (f) a step of thermally treating the tantalum oxide film; and (g) a step of forming a metal film on the tantalum oxide film.

6. The process of manufacturing a semiconductor device according to item 5, wherein temperature of the heat treatment is lower than 700° C.

7. A process of manufacturing a semiconductor device comprises:
   (a) a step of forming first and second MISFETs having a gate electrode, a source region and a drain region on the main surface of a semiconductor substrate; (b) a step of forming a silicide layer having a metal with high melting point on respective surfaces of the source and drain regions; (c) a step forming a first insulating film on the first and second MISFETs; (d) a step of forming a second insulating film greater than the first insulating film in film thickness on the first insulating film; (e) a step of forming a through hole in the second insulating film, the through hole locating on the first MISFET and exposing the surface of the first insulating film; (f) a step of forming a first metal film oriented in a (002) plane on the inner wall of the through hole and on the surface of the first insulating film in the through hole; (g) a step of depositing a dielectric film on the first metal film; (h) a step of thermally treating the dielectric film; and (i) a step of forming a second metal film on the dielectric film.

8. The process of manufacturing a semiconductor device according to item 7, wherein the first metal film is made of ruthenium.

9. The process of manufacturing a semiconductor device according to item 8, wherein the dielectric film is made of tantalum oxide film oriented in a (002) plane.

10. The process of manufacturing a semiconductor device according to item 9, wherein the second electrode is made of ruthenium.

11. The process of manufacturing a semiconductor device according to item 8, wherein temperature of the heat treatment is lower than 700° C.

12. A process of manufacturing a semiconductor device comprises: (a) a step of forming first and second MISFETs having a gate electrode, a source region and a drain region on a main surface of a semiconductor substrate; (b) a step of forming a silicide layer film having a metal with high melting point on both surfaces of the source and drain regions; (c) a step forming a first insulating film on the first and second MISFETs; (d) a step of forming a first metal film oriented in a (002) plane on the first insulating film; (e) a step of depositing a dielectric film on the first metal film; (f) a step of thermally treating the dielectric film; and (g) a step of forming a second metal film on the dielectric film.

13. The process of manufacturing a semiconductor device according to item 12, wherein the first metal film is made of ruthenium.

14. The process of manufacturing a semiconductor device according to item 12 wherein the second electrode is made of ruthenium.

15. The process of manufacturing a semiconductor device according to item 13, wherein the dielectric film is made of a tantalum oxide film oriented in a (002) plane.

The major effects of the present invention as disclosed in the patent application include the following.

(1) A capacity insulating film having a high thermal resistance and a high reliability and being capable of increasing the accumulated electric charge be provided.

(2) The tantalum oxide film can be crystallized by low temperature heat treatment without degrading the metal silicide film of the connecting portions in the distributing wires.

(3) The possible oxidation of the underlying substrate can be suppressed when crystallizing the tantalum oxide film.

(4) Any increase in the connection resistance of the connecting portions in the peripheral circuit region can be suppressed to provide a DRAM having a capacity insulating film showing a high dielectric constant and be adapted to achieve a higher degree of integration with an improved level of performance and reliability.

(5) The surface area of the lower electrode of the information storage capacity element can be increased to raise the accumulated electric charge.

BEST MODE FOR CARRYING OUT THE INVENTION

Now, embodiments of the present invention will be described in detail on the basis of the accompanying drawings. Moreover, when the embodiments are described, the same reference number in all the drawings denotes a member having the same foundation in all the drawings. An explanation about the same member will not be reiterated.

Embodiment 1

Figure 1:
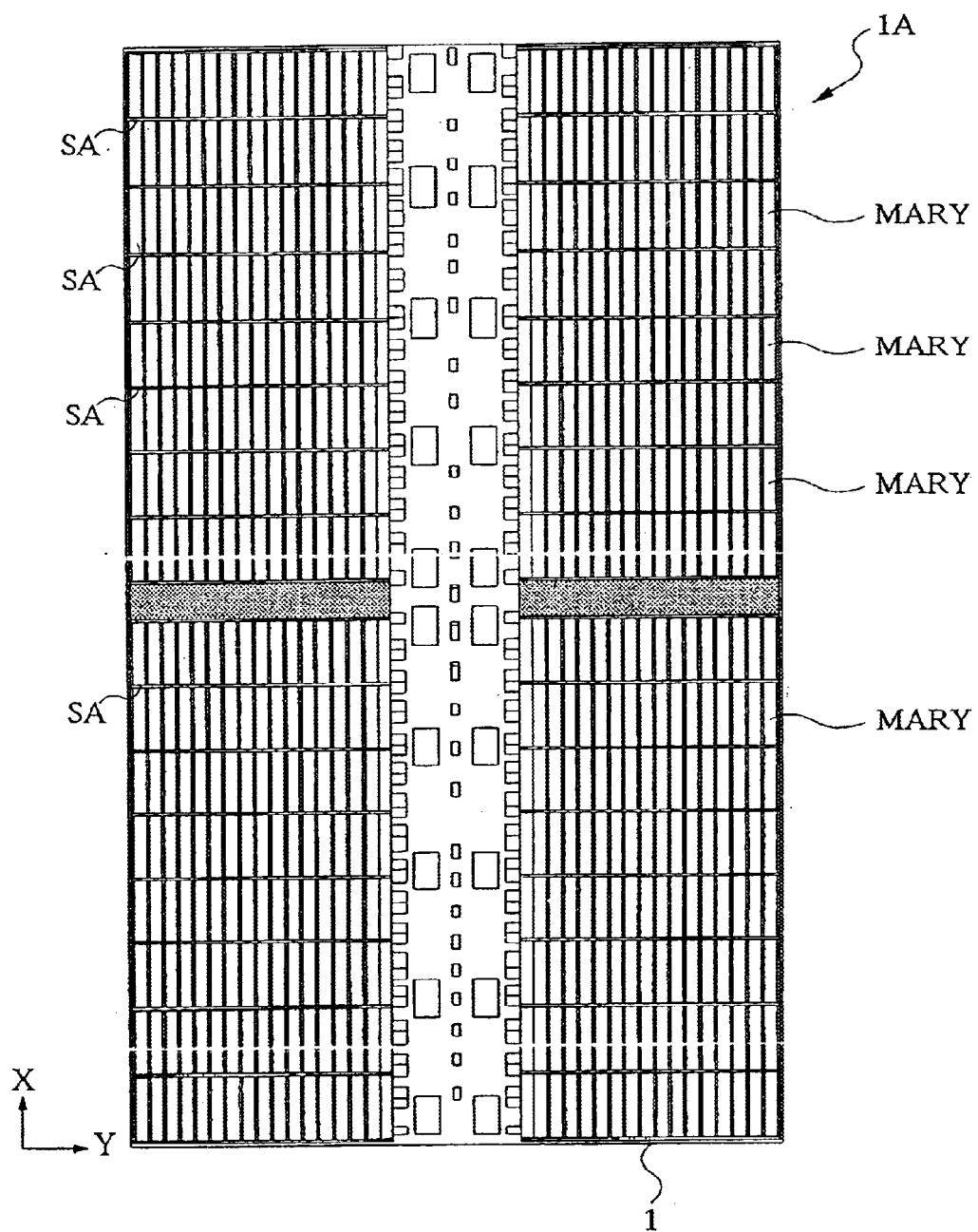
FIG. 1 is a schematic plan view of a semiconductor chip carrying the DRAM of Embodiment 1 of the invention.

FIG. 1 is an entire plane view of a semiconductor chip forming a DRAM of Embodiment 1. As shown in FIG. 1, a semiconductor chip 1A made of single crystal silicon has a number of memory arrays MARY provided on a main surface thereof. The memory arrays MARY are arranged along an X-direction (a direction of long sides of the semiconductor chip 1A) and a Y-direction (a direction of short sides of the semiconductor chip 1A) to form a matrix shape. Each of sense amplifiers SA locates between memory arrays MARY and MARY adjacent to each other along the X-direction. Word drivers WD, control circuits such as data line selection circuits, input/output circuits, and bonding pads are arranged in a central part of the main surface of the semiconductor chip 1A, respectively.

Figure 2:
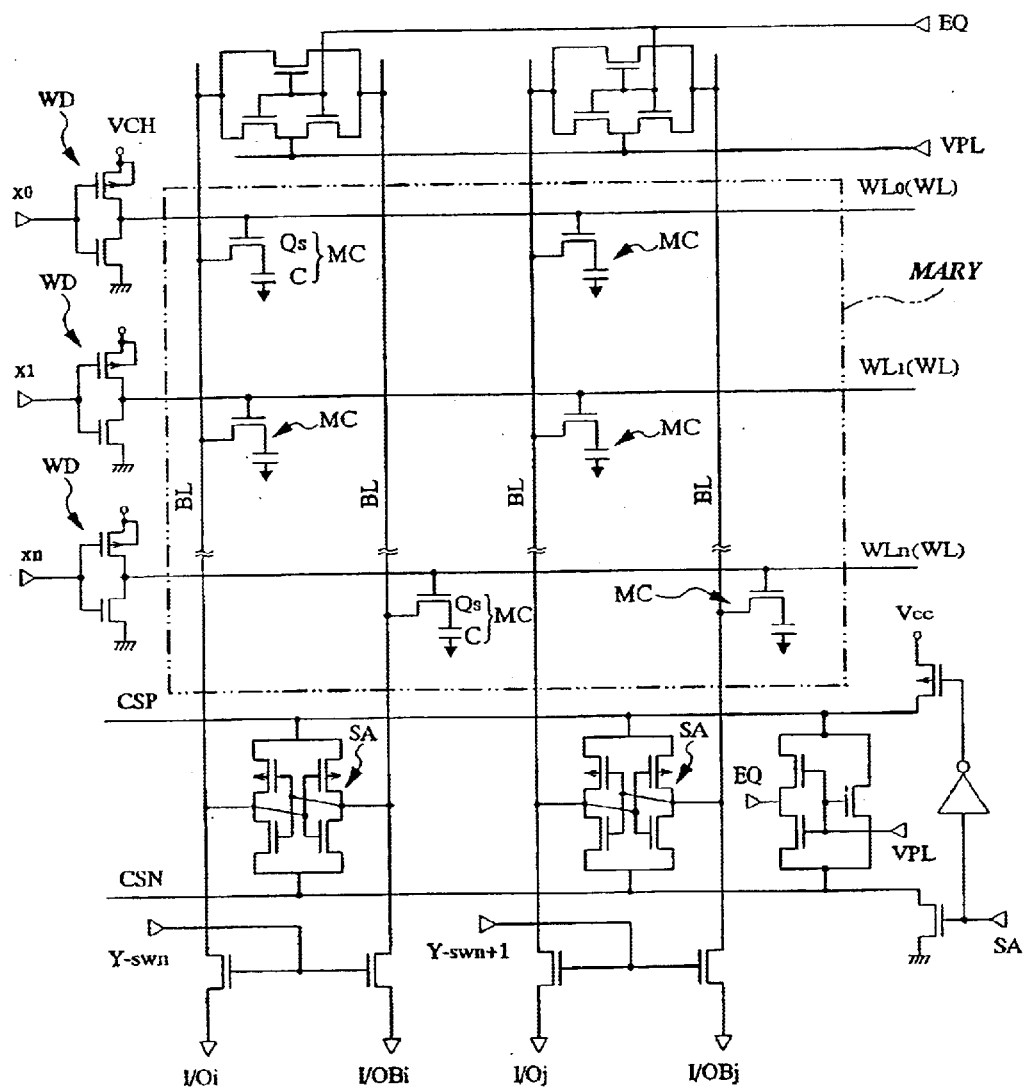
FIG. 2 is an equivalent circuit diagram of the DRAM of Embodiment 1 of FIG. 1.

FIG. 2 is an equivalent circuit diagram of the DRAM of Embodiment 1. As shown, each of the memory arrays (MARY) of this DRAM comprises a plurality of word lines (WL0, WL1, . . . , WLn), a plurality of bit lines BL perpendicular to the word lines to form a matrix shape, and a plurality of memory cells (MC) arranged at each of intersections that both lines intersect. Each of the memory cells which stores a 1-bit data comprises an information storage capacity element C and a memory cell selection MISFET Qs connected in series thereto. One of a source and drain of the memory cell selection MISFET Qs is electrically connected to the information storage capacity element C while the other is electrically connected to one of the bit lines BL. One end of the respective word lines WL is connected to the respective word drivers WD while one end of the bit lines BL is connected to the sense amplifiers SA, respectively.

Now, a process of manufacturing the DRAM of this embodiment will be described by referring to the related drawings in order of manufacturing steps. FIGS. 3 through 25 are schematic cross sectional views showing, in order of manufacturing steps, one example of processes of manufacturing the DRAM of Embodiment 1.

Figure 3:
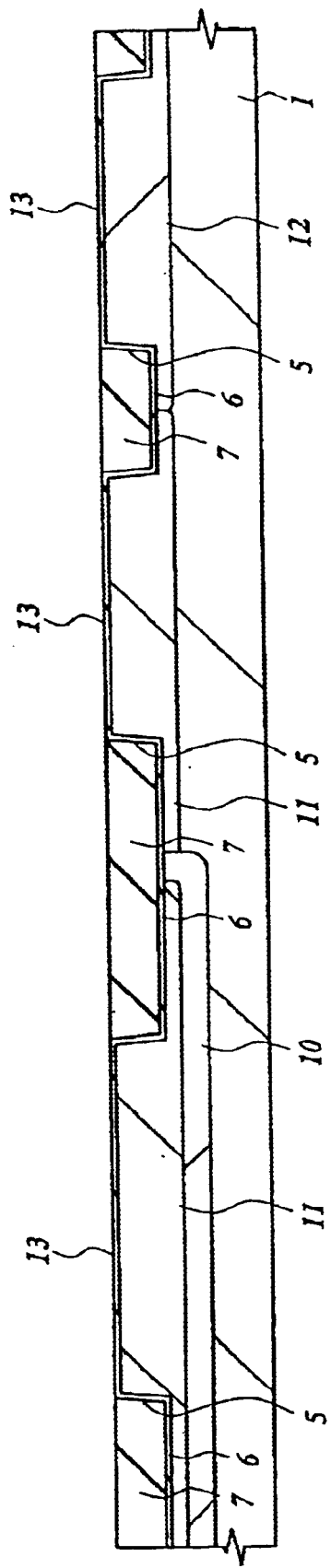
FIGS. 3 through 25 are schematic cross sectional views of the DRAM of Embodiment 1 shown in the order of the steps of manufacturing it.

Firstly, as shown in FIG. 3, both element isolation regions and well regions doped with an impurity are formed. A semiconductor substrate 1 made of p-type single crystal silicon is prepared having resistivity of about 10 Ωcm. A thin silicon oxide film (not shown) formed by wet oxidation, for example, at about 850° C. and having a film thickness of about 10 nm and a silicon nitride film (not shown), for example, formed by CVD (chemical vapor deposition), having about 140 nm in film thickness are deposited on the semiconductor substrate 1. While the semiconductor substrate 1 of the present invention is made of single crystal, it may be replaced by an SOI (Silicon On Insulator) substrate having at lease one single crystal silicon layer on the surface. Or, it may be replaced by a dielectric substrate of glass, ceramics or the like, the dielectric substrate having at least one polycrystalline silicon film on surfaces thereof.

Then, grooves 5 is formed, each of which has a depth of about 300 to 400 nm in the element isolation regions of the semiconductor substrate 1, by the following methods: by using a photoresist film (not shown) as a mask to pattern said silicon nitride film and said silicon oxide film in regions for forming the grooves 5 and then by using the silicon nitride film as a mask to dry etching the semiconductor substrate 1.

After the photoresist film is removed, a thin silicon oxide film 6 (with about 10 nm in film thickness) is formed on inner walls in the grooves 5 by wet oxidation, for example, at about 850 to 900° C. in order to remove damaged layers produced on the inner walls of the grooves 5 as a result of the above etching operation. Then, a silicon oxide film (not shown), which is deposited by plasma CVD method, for example, using ozone ($O_3$) and tetraethoxysilane (TEOS) as source gas, is deposited on the thin silicon oxide film 6 by about 300 to 400 nm. The deposited silicon oxide film may be sintered by dry oxidation at about 1,000° C.

Subsequently, this silicon oxide film is polished by CMP method to remove the other silicon oxide film deposited except for the grooves 5. Element isolation regions are formed in a condition where a silicon oxide film 7 remains inner each of the grooves 5. On the other hand, a silicon nitride film provided in an area of each of the grooves 5 before the polishing operated by the CMP method, can prevent the silicon oxide film inner the respective grooves 5 from be dished, that is, polished too deeply.

Then, the silicon oxide and nitride films remaining on the surface of the semiconductor substrate 1 are removed, for example, by wet etching method using hot phosphoric acid. Thereafter, an n-type impurity, such as an n-type semiconductor region 10 provided by ion-implanting P (phosphor), is formed in the semiconductor substrate 1 belonging to areas (the memory arrays) for providing the memory cells. P-type impurities, such as p-type wells 11 provided by ion-implanting B (boron), are formed in areas of both the memory arrays and one part of a peripheral circuit (that is, areas for providing with an n-channel type MISFET). An n-type impurity, such as an n-type well 12 provided by ion-implanting P (phosphor), is formed in the other parts of the peripheral circuit (that is, areas for providing with a p-channel type MISFET). Subsequent to the ion-implanting operation, some impurities for regulating a threshold voltage of the MISFETs, such as $BF_2$ (boron fluoride) are ion-implanted into the p-type wells 11 and the n-type well 12. The n-type semiconductor region 10 is formed in order to prevent noises from penetrating into the p-type wells 11 of the memory arrays through the semiconductor substrate 1 from an input/output circuit or the like.

Then, after the surface of the semiconductor substrate 1 is cleansed by means of cleansing solution, for example, cleansing solution of an HF (hydrofluoric acid) type, the semiconductor substrate 1 is oxidized at about 850° C. by wet oxidation to form, on each of all surfaces of the p-type wells 11 and the n-type well 12, clean gate oxide films 13 with about 7 nm in thickness. The present invention does not have specific limits. But, after the above-mentioned gate oxide films 13 are formed, heat treatment of the semiconductor substrate 1 under an NO (nitrogen oxide) or $NO_2$ (nitrogen dioxide) atmosphere may segregate nitrogen along an interface between the gate oxide films 13 and the semiconductor substrate 1 (oxidizing/nitrifying treatment). As the gate oxide films 13 become about 7 nm in film thickness, stress generated along the interface between the gate oxide films 13 and the semiconductor substrate 1 due to difference of thermal expansion coefficient thereof is gradually actualized, thereby being caused to generate hot carriers. The nitride segregated along the interface alleviates this stress so that the above-mentioned oxidizing/nitrifying process can improve reliability of the gate oxide films 13 that is extremely thin.

Figure 4:
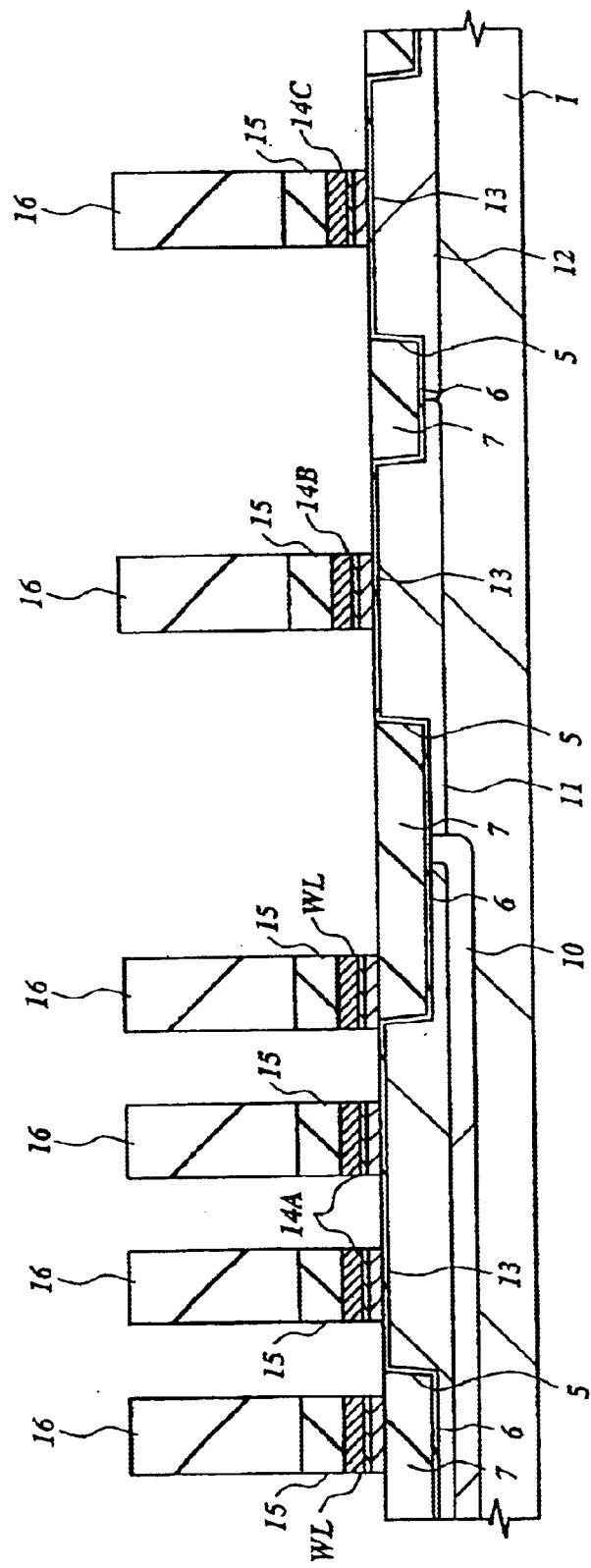

Then, referring to FIG. 4, gate electrodes 14A, 14B and 14C are formed on tops of the gate oxide films 13, respectively. The gate electrodes 14A constitute a part of the memory cell selection MISFET and are used as the word lines WL outside active region thereof. Width, or gate length of the respective gate electrodes 14A (the word lines WL) is the smallest measurements (for example, about 0.24 µm) in such a permitted limit that short-channeled effect of the memory cell selection MISFET is suppressed and that threshold voltage thereof is kept a value above a predetermined level. Each of gaps between the adjacent gate electrodes 14A (the word lines WL) is the smallest measurements (for example, about 0.22 µm) that is determined by a resolution limit of the photolithography. The gate electrodes 14B and 14C constitute parts of the n-channel and p-channel MISFETs of the peripheral circuits, respectively.

The gate electrodes 14A (the word lines WL) and the gate electrodes 14B and 14C are formed by: depositing a polycrystalline silicon film being about 70 nm in film thickness and being doped with an n-type impurity such as P (phosphor) on the semiconductor substrate 1 by the CVD method, subsequently depositing both a WN (tungsten nitride) film with about 50 nm and a W film with about 100 nm thereon by a sputtering method, moreover depositing silicon nitride films 15 with about 150 nm thereon by the CVD method, and thereafter patterning these films using photoresist films 16 as a mask. The WN film operates as a barrier layer that prevents both the W and the polycrystalline silicon films from reacting each other and forming an electrically highly resistant silicide film along interfaces between both films thereof during high temperature and heat treatments. The barrier layer may be made of a TiN (titanium nitride) film or the like in addition to the WN film.

If the gate electrodes 14A (the word lines WL) are partly made of metal materials (W) with low resistance, sheet resistance thereof can be reduced to about 2 to 2.5 $\Omega/\square$, so that delay of the word lines can be reduced. Then, consequently as the word line delay is reduced without lining the gate electrodes 14A (the word lines WL) with Al distributing wires, wiring layers formed on the memory cells can decrease one in layer number.

Next, after the photoresist films 16 are removed, both dry etching residue and photoresist residue attached on the surface of the semiconductor substrate 1 are removed by using an etching solution such as hydrofluoric acid or the like. When this wet etching is performed, the gate oxide films 13 are striped off regions other than those located under lower portions of the gate electrodes 14A (the word lines WL) and the gate electrodes 14B, 14C. At the same time, the gate oxide films 13 are isotropically etched in regions located under the lower portions of the gate electrodes 14A, 14B and 14C, so that the etched oxide films located under the lower portions bring about undercuts. If no counter-measures are taken, the withstand voltage of the gate oxide film 13 is reduced. Therefore, film quality of each of the striped gate oxide films 13 is improved by wet-oxidizing the semiconductor substrate 1 at about 900° C.

Figure 5:
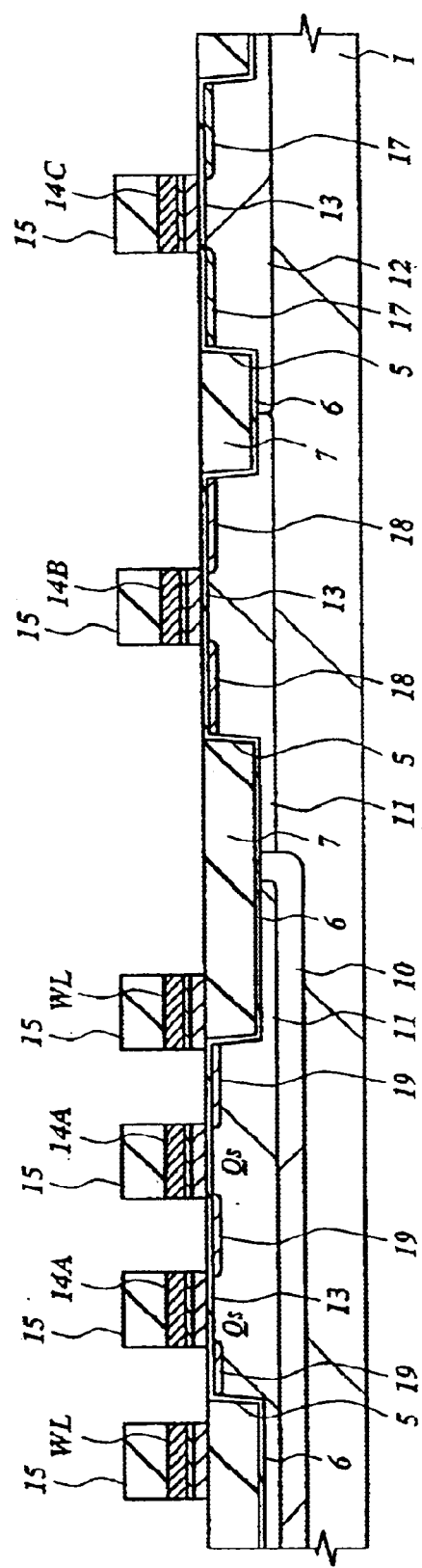

Then, referring to FIG. 5, an n-type impurity such as B (boron) is ion-implanted into the n-type well 12 to form $p^-$-type semiconductor regions 17 at the both sides of the gate electrode 14C in the n-type well 12. And, a p-type impurity such as P (phosphor) is ion-implanted into the p-type well 11 to form $n^-$-type semiconductor regions 18 at the both sides of the gate electrode 14B and n-type semiconductor regions 19 at the both sides of the respective gate electrodes 14A in the p-type well 11. By this means, the memory cell selection MISFET Qs is produced in the memory arrays, respectively.

Figure 6:
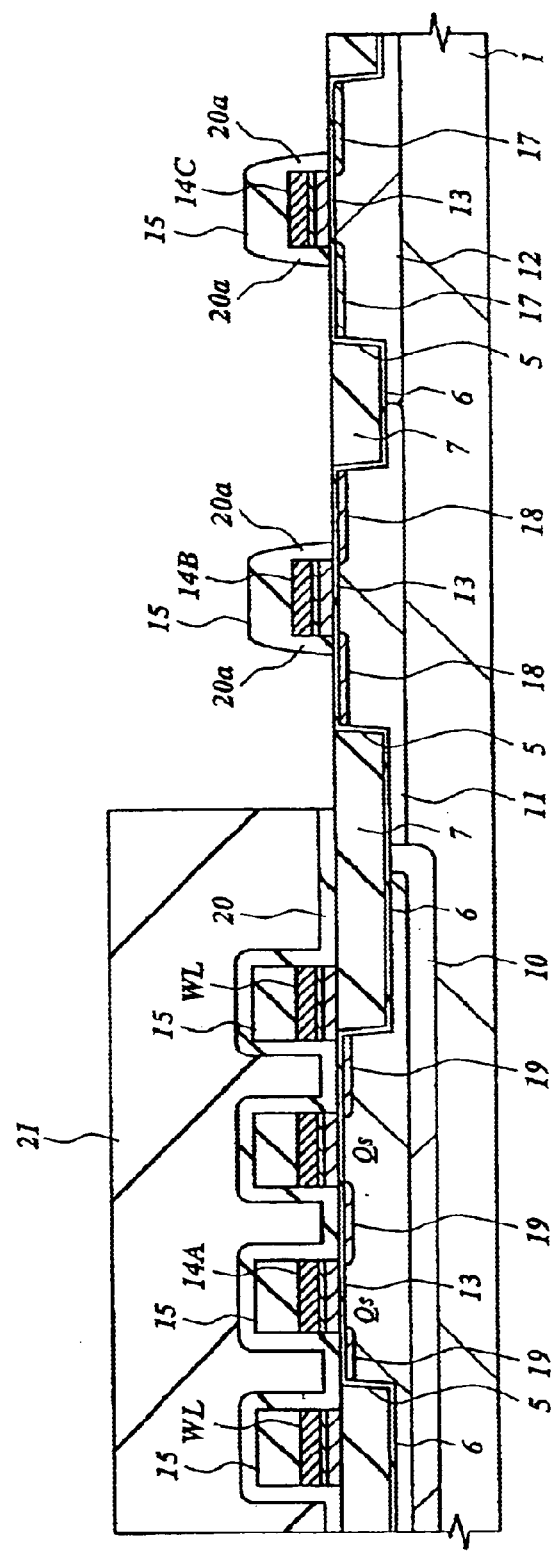

Now, referring to FIG. 6, after silicon nitride film 20 with about 50 to 100 nm in film thickness is deposited on the semiconductor substrate 1 by the CVD method, the deposited silicon nitride film 20 is covered by a photoresist film 21 in each of the memory arrays and the deposited silicon nitride film 20 corresponding to the peripheral circuit is anisotropically etched. Therefore, side wall spacers 20a are formed on the outer walls of the gate electrodes 14B and 14C, respectively. Such etching gas that rate of etching the silicon nitride film 20 is increased relative to the silicon oxide film 7 is used to minimize an striped amount of silicon oxide film 7 buried in both the gate oxide films 13 and the element isolating grooves 5. Additionally, an amount of over-etching is also minimized within required range in order to minimize the silicon nitride films 15 striped on the gate electrodes 14B and 14C.

Figure 7:
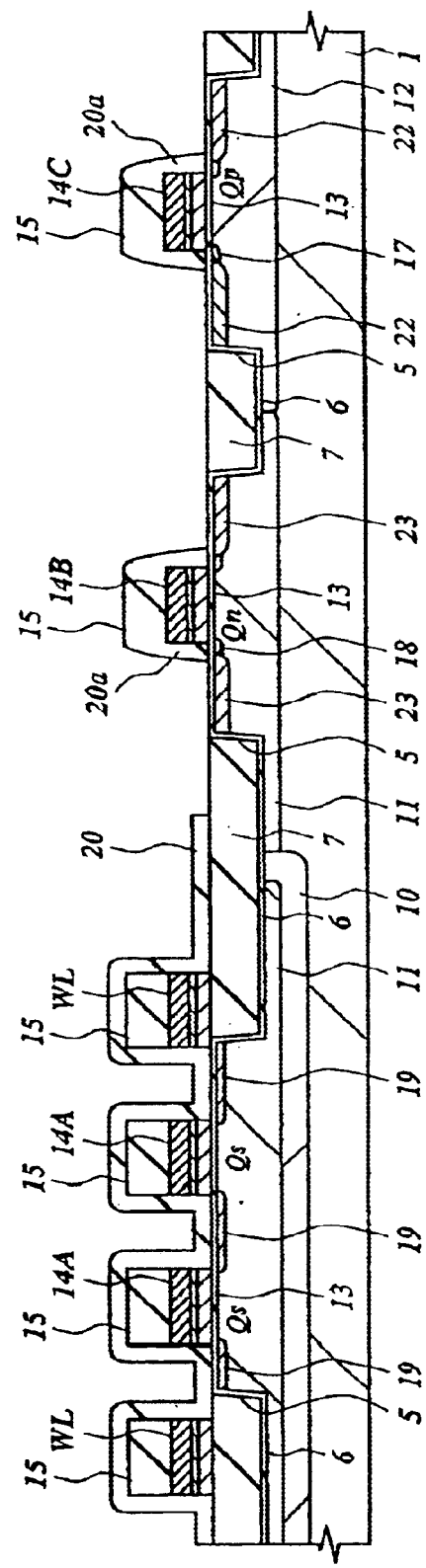

Then, referring to FIG. 7, after the photoresist film 21 is removed, a p-type impurity such as B (boron) is ion-implanted into the n-type well 12 in regions of the peripheral circuit to form $p^+$-type semiconductor regions 22 (source and drain) of the p-channel type MISFET. And, an n-type impurity such as As (arsenic) is ion-implanted into the p-type well 11 in regions of the peripheral circuit to form $n^+$-type semiconductor regions 23 (source and drain) of the n-channel type MISFET. By this means, both the p-channel type MISFET Qp and the n-channel type MISFET Qn having an LDD (lightly doped drain) structure are formed in the region of the peripheral circuit.

Figure 8:
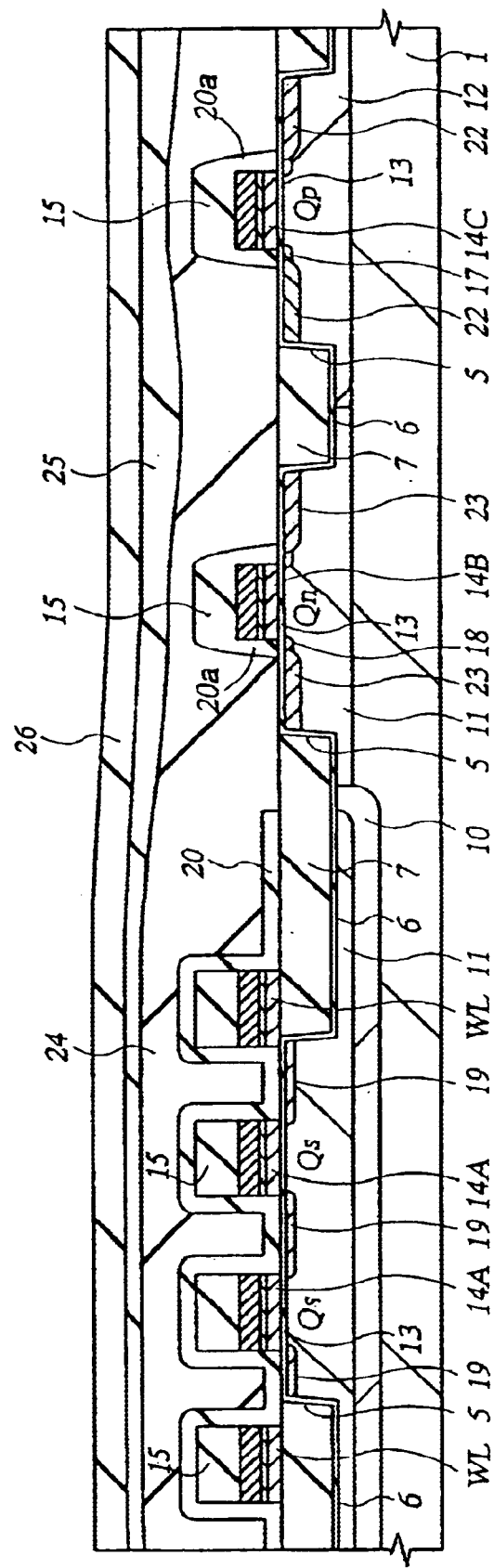

Thereafter, referring to FIG. 8, after a SOG (spin on glass) film 24 with about 300 nm in thickness is spin-coated on the semiconductor substrate 1, the semiconductor substrate 1 is heated at 800° C. for about 1 minute to sinter the SOG film 24. Then, after a silicon oxide film 25 with about 600 nm in thickness is deposited on upper regions of the SOG film 24, the deposited silicon oxide film 25 is polished by the CMP method and a surface thereof is Planarized. Moreover, a silicon oxide film 26 with about 100 nm in thickness is deposited on upper regions of the silicon oxide film 25. This deposited silicon oxide film 26 repairs fine damage that may be caused on surfaces of the silicon oxide film 25 polished by the CMP method. The silicon oxide films 25 and 26 may be deposited, for example, by plasma CVD method using ozone ($O_3$) and tetraethoxysilane (TEOS) as source gas. A PSG (phospho silicate glass) film or the like may replace the silicon oxide film 26.

Thus, with this embodiment, the SOG film 24 having highly reflow characteristics is coated on the top portions of the gate electrodes 14A (the word lines WL) and the gate electrodes 14B and 14C and then the silicon oxide film 25 coated on top portions of the deposited SOG film 24 is planarized by the CMP method. By this means, fine gaps between the adjacent gate electrodes 14A (the word lines WL) is improved in gap-fill characteristics. At the same time, an insulating film can be planarized which is formed on the top portions of the gate electrodes 14A (the word lines WL) and the gate electrodes 14B and 14C. That is, flatness of the insulating film can be achieved.

Figure 9:
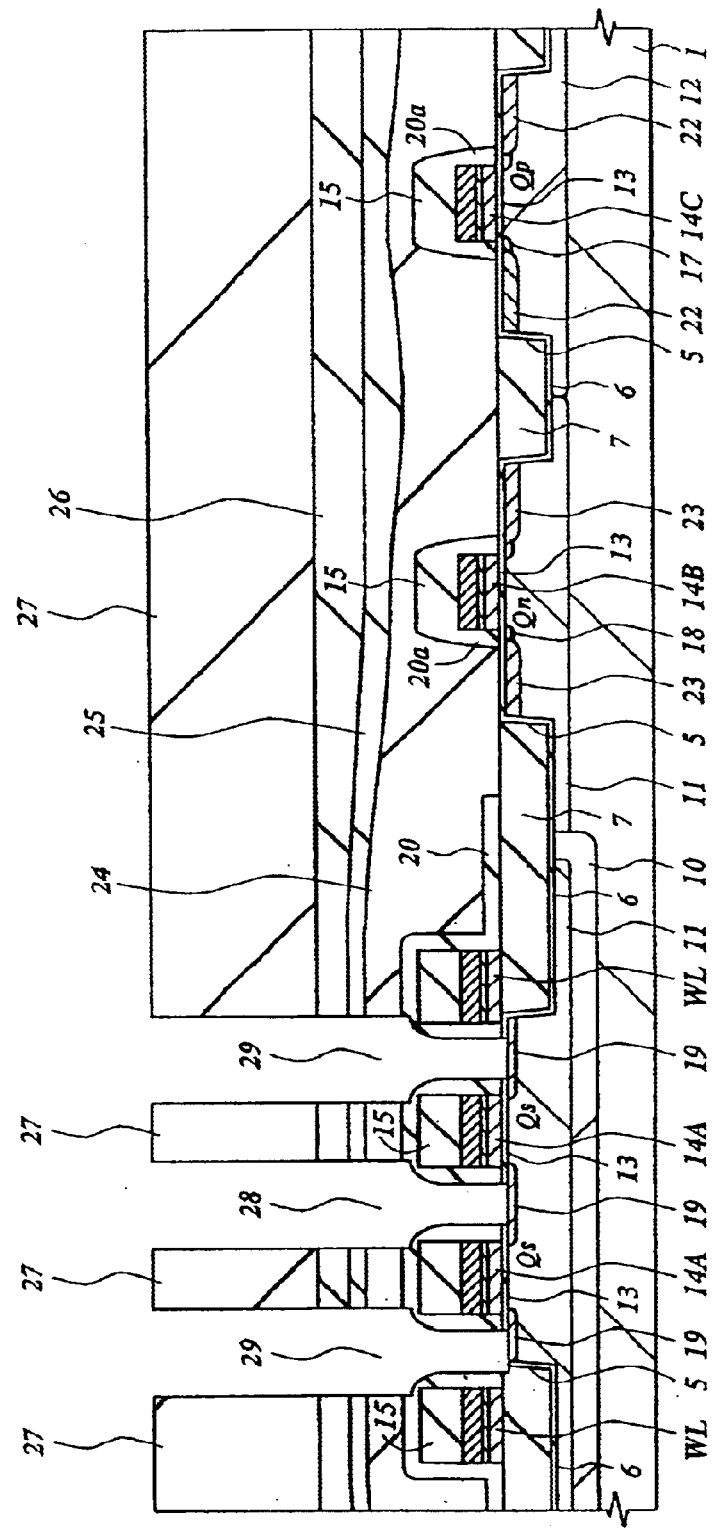

Next, referring to FIG. 9, the silicon oxide films 25 and 26 and the SOG film 24 on the n-type semiconductor regions 19 (source and drain) of the memory cell selection MISFET Qs are removed by using and dry-etching photoresist films 27 as a mask. This etching operation is conducted, under the condition that the rate of etching the silicon oxide films 26 and 25 and the SOG film 24 can be increased relative to the silicon nitride film 20, so that the silicon nitride film 20 covering both the n-type semiconductor regions 19 and the top of the element isolating grooves 5 may not be completely removed. Subsequently, both the silicon nitride film 20 and the gate oxide film 13 located on the n-type semiconductor regions 19 (source, drain) of the memory cell selection MISFET Qs are removed by dry-etching, using the above-mentioned photoresist film 27 as a mask to produce a contact hole 28 on one of the n-type semiconductor regions 19 (source, drain) and contact holes 29 on the other of the n-type semiconductor regions. This etching operation is conducted, under the conduction that the rate of etching the silicon nitride film 15 can be increased relative to the silicon oxide films, (the gate oxide film 13 and the silicon oxide film 7 in the element isolating grooves 5) so that the n-type semiconductor regions 19 and the element isolating grooves 5 may not be stripped too deeply. Additionally, this etching operation is conducted, under the condition that the silicon nitride film 20 is anisotropically etched, so that the silicon nitride film 20 may be left on the outer walls of the gate electrodes 14A. As a result, contact holes 28 and 29, each having a minute diameter that is within a resolution limit of photolithography, are formed by a self-aligning manner relative to the gate electrodes 14A (the word lines WL). Note that before the contact holes 28 and 29 are formed by the self-aligning manner relative to the gate electrodes 14A (the word lines WL), by anisotropically etching the silicon nitride film 20 in advance, wide wall spacers may be formed on the outer walls of the gate electrodes 14A (the word lines WL).

Figure 18:
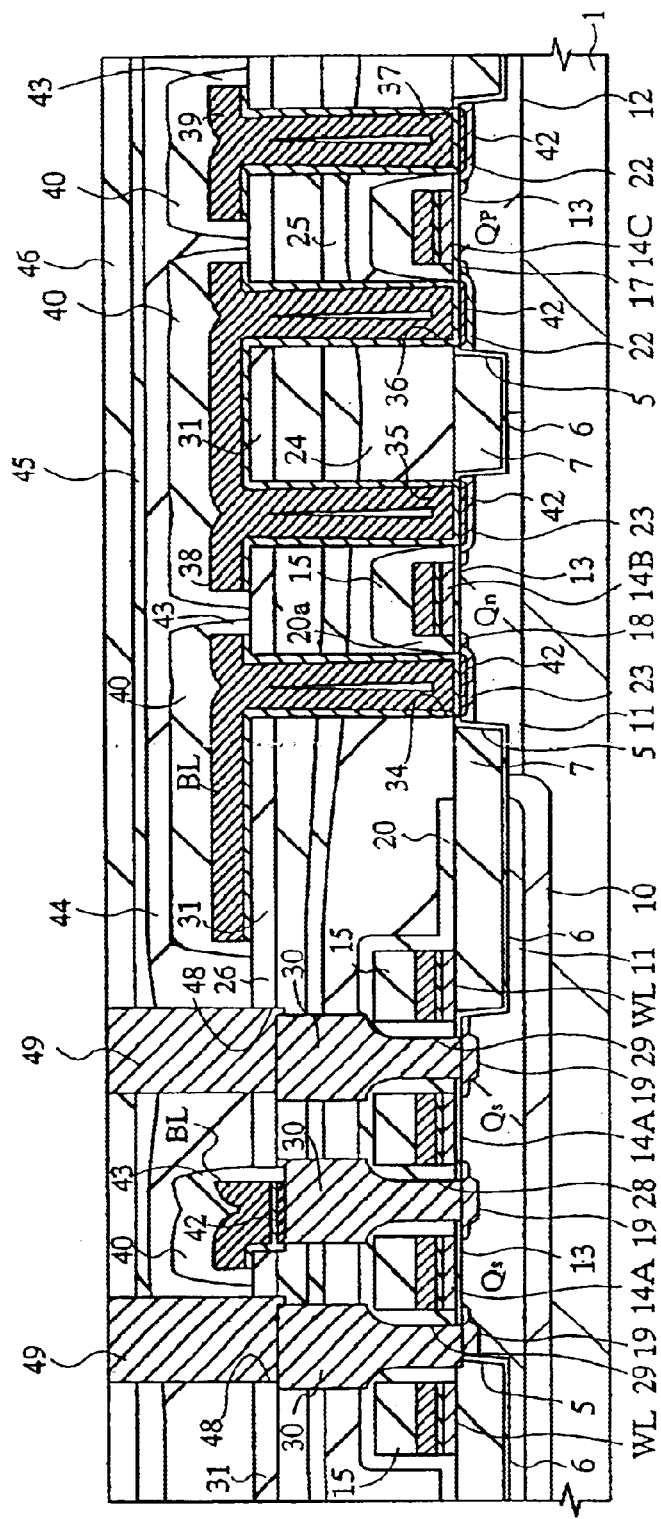

Note also that altogether each of surfaces of the silicon oxide film 26 and the photoresist film 27 in FIG. 9 has a depression (step) shape along outer surface of the silicon oxide film 25 in the regions of the peripheral circuit as shown in FIG. 18, the depression shape is omitted from FIG. 9.

Then, after removing the photoresist film 27, the dry etching residue and the photoresist residue being on the surface of the semiconductor substrate 1 and being exposed at bottom portions of the contact holes 28 and 29 are removed by means of using an etching solution such as a mixed solution typically containing hydrofluoric acid and ammonium fluoride. At this time, while the SOG film 24 exposed on the outer walls of the contact holes 28 and 29 are also attacked by the etching solution, inner walls in the contact holes 28 and 29 is not significantly undercut by this wet etching operation because rate of etching the SOG film 24 of hydrofluoric type etching solution is reduced as a result of the above-described sintering operation at about 800° C. Therefore, any risk of short-circuiting plugs to be buried in the respective contact holes 28 and 29 can be reliably prevented from arising in a next step.

Figure 10:
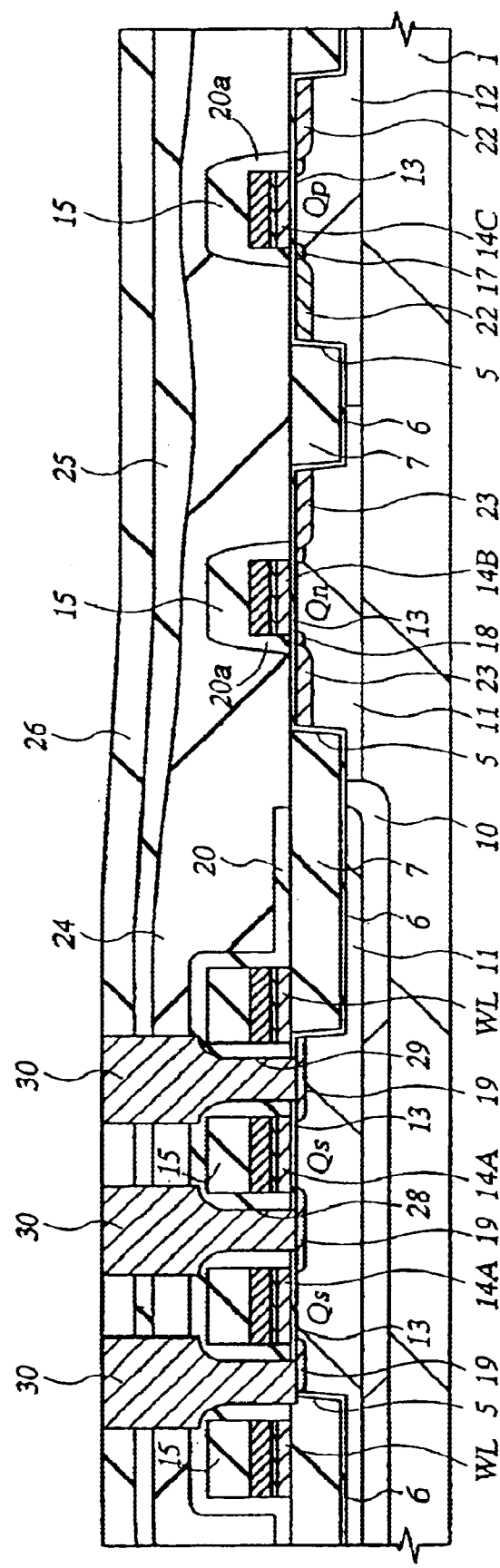

Then, referring to FIG. 10, plugs 30 are formed in the contact holes 28 and 29. After depositing a polycrystalline silicon film doped with an n-type impurity (e.g., P (phosphor)) on the silicon oxide film 26 by the CMP method, the plugs 30 is formed by polishing the polycrystalline silicon film and by putting the polycrystalline film in the inside of the contact holes 28 and 29.

Figure 11:
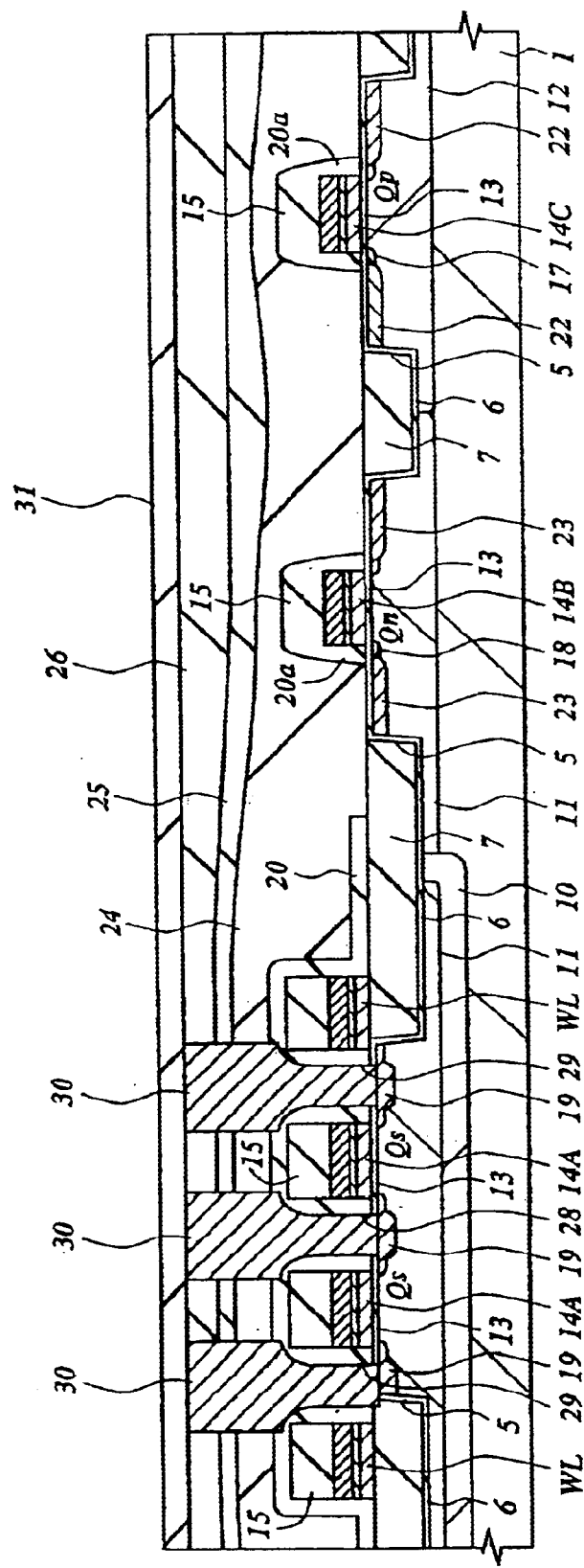

Subsequently, referring to FIG. 11, after depositing an bout 200 nm thick silicon oxide film 31 on the silicon oxide film 26, the semiconductor substrate 1 is thermally treated at about 800° C. The silicon oxide film 31 is deposited by the plasma CVD method using ozone ($O_3$) and tetraethoxysilane (TEOS) as source gas. As a result of this heat treatment, the n-type impurity remaining in the polycrystalline silicon film of the plugs 30 is diffused from bottoms of the contact holes 28 and 29 into the n-type semiconductor regions 19 (source, drain) of the memory cell selection MISFET Qs and, thereby, resistance of the perspective n-type semiconductor regions 19 is reduced.

Figure 12:
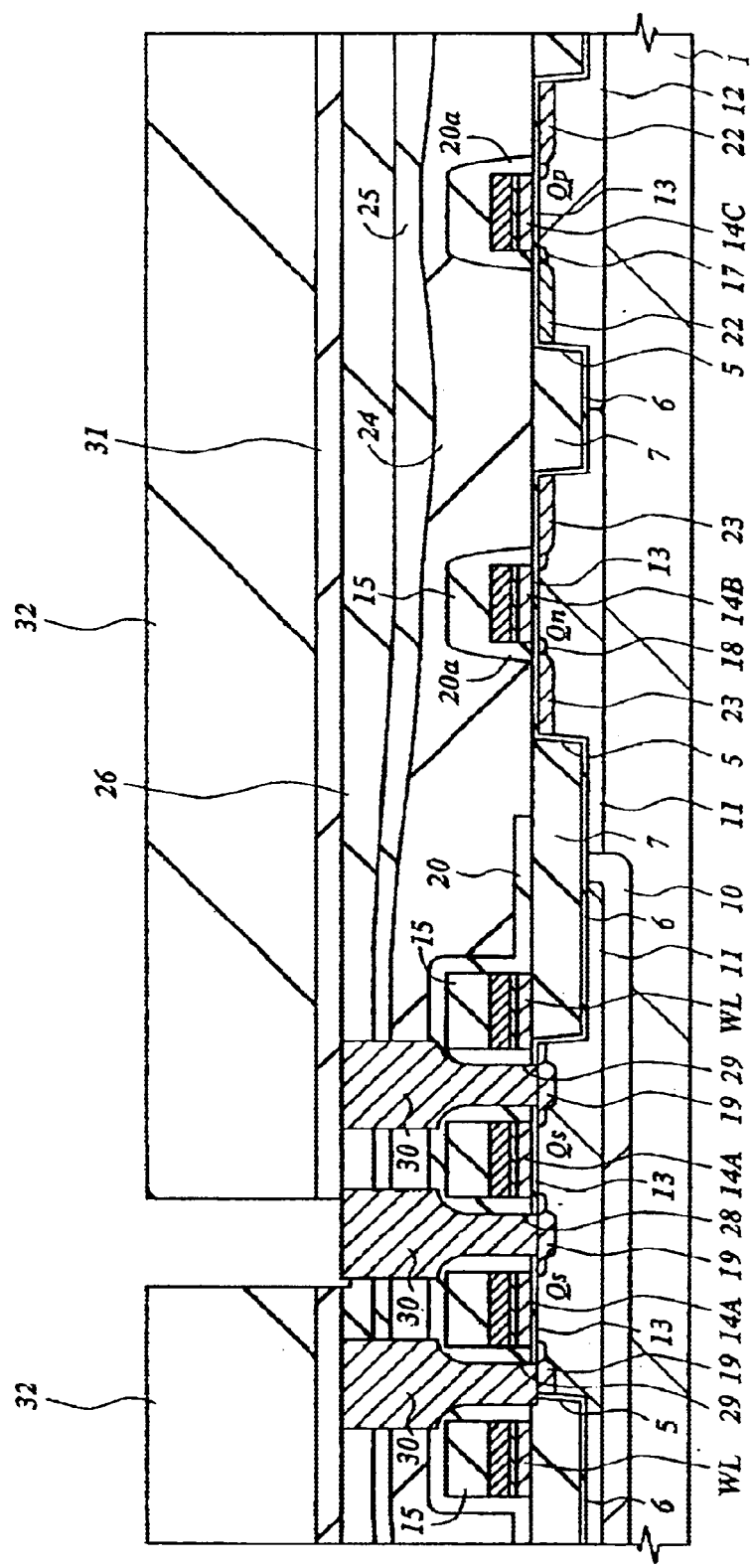
Figure 13:
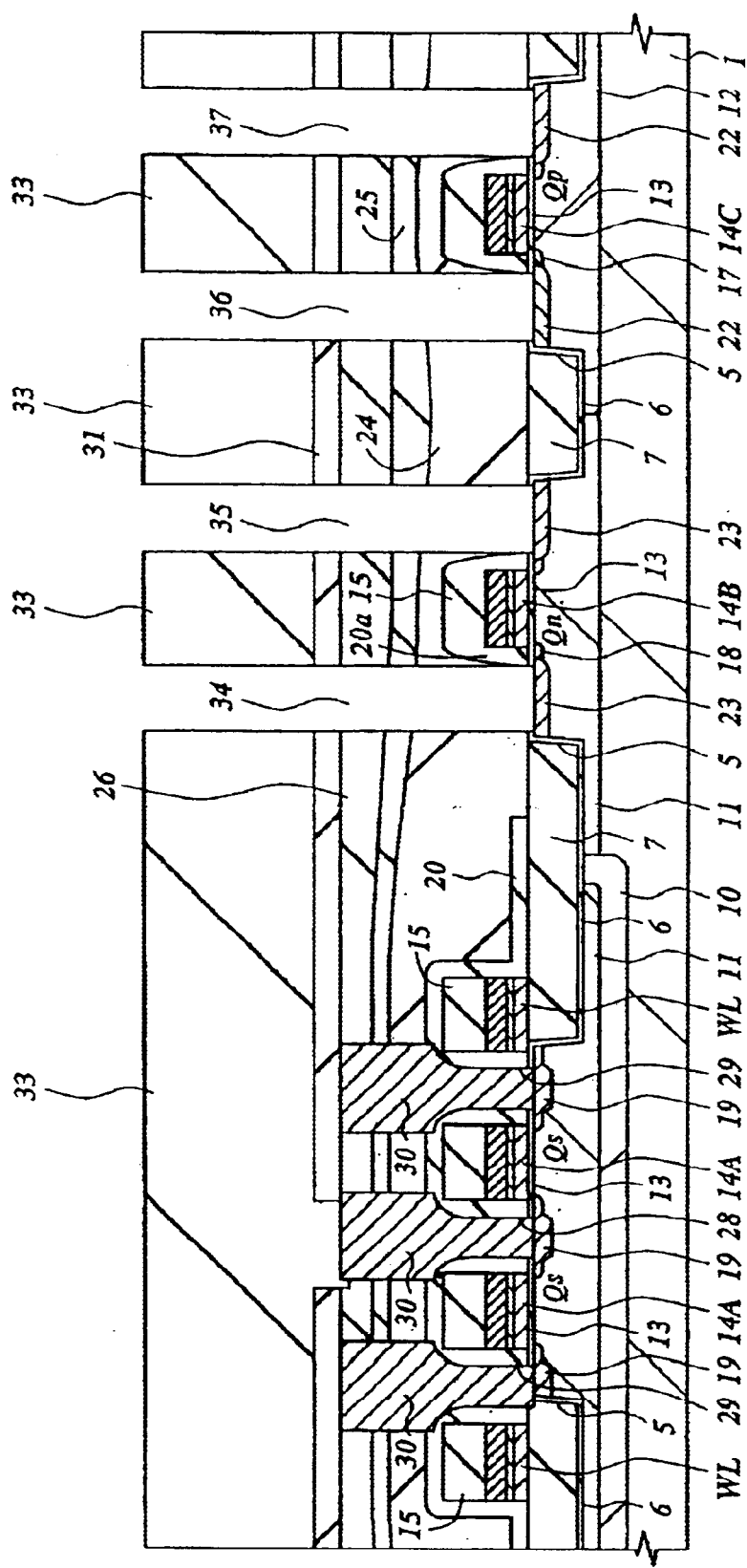

Then, as referring to FIG. 12, the silicon oxide film 31 on the contact hole 28 is removed by dry-etching using photoresist film 32 as a mask to expose a surface of the respective plugs 30. Then, referring to FIG. 13, after removing the photoresist film 32, contact holes 34 and 35 are formed on the n$^+$-type semiconductor regions 23 (source, drain) of the n-channel type MISFET Qn and contact holes 36 and 37 are formed on the p$^+$-type semiconductor regions 22 (source, drain) of the p-channel type MISFET Qp by removing the silicon oxide films 25, 26 and 31, the SOG film 24 and the gate oxide film 13 in the regions of the peripheral circuit by dry-etching using the photoresist film 33 as a mask.

Figure 14:
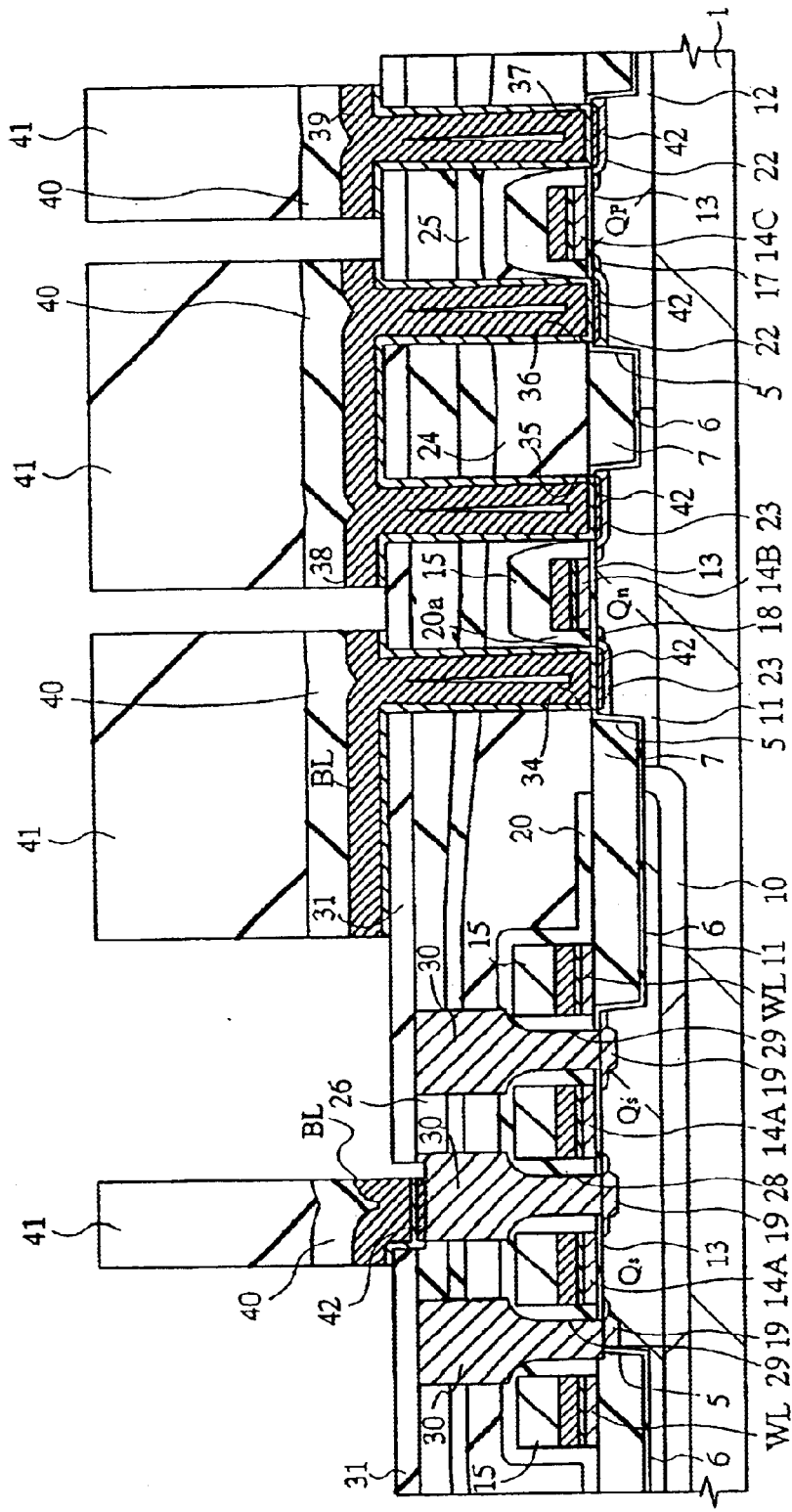

Next, referring to FIG. 14, after removing the photoresist film 33, the bit lined BL and first layer distributing wires 38 and 39 of the peripheral circuit are formed on the silicon oxide film 31. A means of forming the bit lines BL and the first layer distributing wires 38 and 39 includes steps of firstly depositing an about 50 nm thick Ti film on the silicon oxide film 31 by the sputtering method, thermally treating the semiconductor substrate 1 at about 800° C., depositing an about 50 nm thick TiN film on the Ti film by the sputtering method, depositing an about 150 nm thick W film and an about 200 nm thick silicon nitride film 40 on the TiN film by the CVD method, and thereafter using photoresist film 41 as a mask to pattern these films.

As a result of thermally treating the semiconductor substrate 1 at about 800° C. after depositing the Ti film on the silicon oxide film 31, the Ti film and the underlying Si thereof react each other to produce a TiSi$_2$ (titanium silicide) layer 42 with low resistance. The TiSi$_2$ (titanium silicide) layer 42 is formed on all the surfaces of the n$^+$-type semiconductor regions 23 (source, drain) of the n-channel type MISFET Qn, the p$^+$-type semiconductor regions 22 (source, drain) of the p-channel type MISFET Qp and the plugs 30. Consequently, contact resistance of the distributing wires (the bit lines BL, the first layer distributing wires 38 and 39) connected to the n$^+$-type semiconductor regions 23, the p$^+$-type semiconductor regions 22 and the plugs 30 can be reduced. Additionally, as a valed of sheet resistance thereof can be reduced to less than 2Ω/□ by forming the bit lines BL of arrangement of W film/TiN film/Ti film, it is possible to improve data reading speed and data writing speed of some information. Furthermore, since the bit lines BL and first layer distributing wires 38 and 39 of the peripheral circuit can be formed in one step and at the same time, it is possible to reduce several processes of manufacturing the DRAM. Still additionally, if the first layer distributing wires (38 and 39) of the peripheral circuit are formed in a layer having the bit lines BL, aspect ratio of the contact holes (34 through 37) connecting the MISFETs (n-channel type MISFET Qn and p-channel type MISFET Qp) of the peripheral circuit to the first layer distributing wires can be reduced to and thereby connection reliability of the first layer distributing wires is improved, in comparison with the case where the first layer distributing wires are formed by Al distributing wires arranged in a layer above each of the memory cells.

The respective bit lines BL are formed such that each gap between the adjacent bit lines BL is longer than a width of the respective bit lines BL in length in order to reduce parasitic capacitance created between the adjacent bit lines BL and consequently improve both data reading speed and data writing speed. The respective gaps between the bit lines BL are, for example, about 0.24 $\mu$m, while the width thereof is about 0.22 $\mu$m in length.

Although the TiSi$_2$ layer 42 can be degraded by heat treatment, a step of forming a capacity insulation film for the information storage capacity element as described hereinafter is generally considered. However, as described hereinafter, the step of forming the capacity insulation film is conducted at low temperature in the present embodiment, so that there does not arise any problem such as degradation of the TiSi$_2$ layer 42, resultant rise in the connection resistance after the heat treatment and the like.

Figure 15:
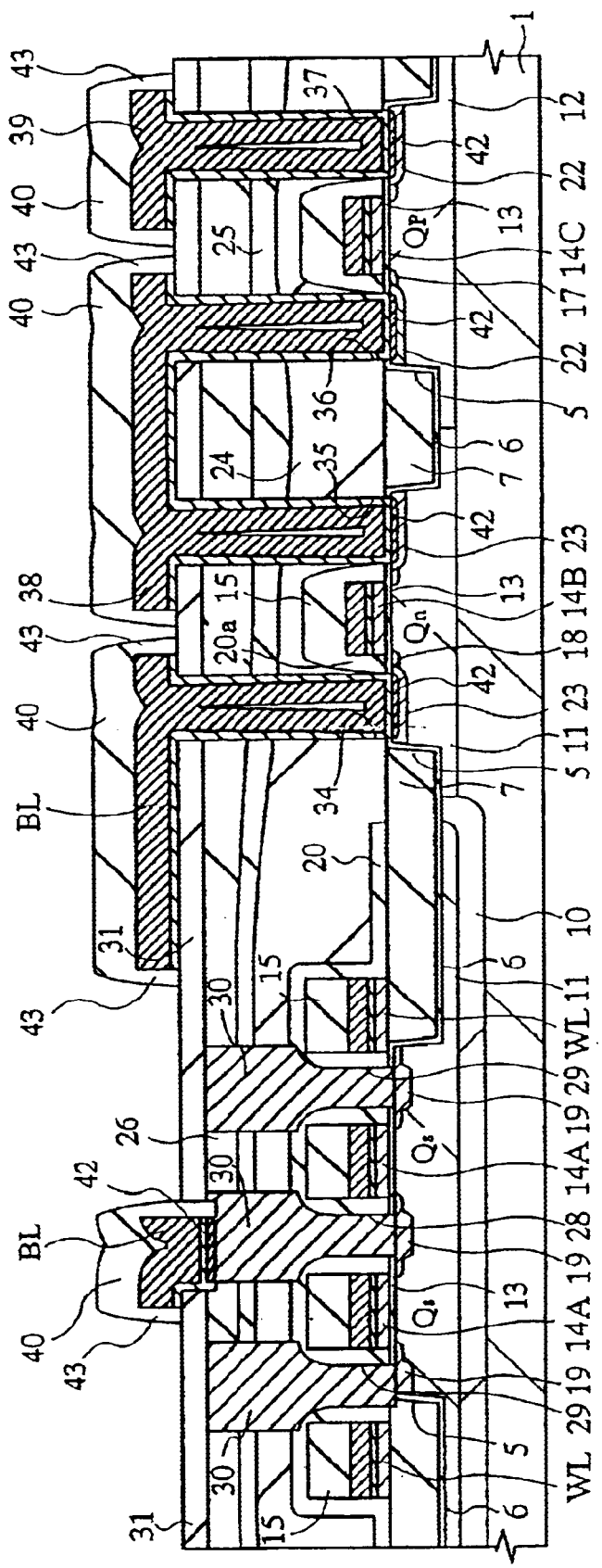

Then, referring to FIG. 15, after removing the photoresist film 41, side wall spacers 43 are formed between the outer walls of the bit lines BL and the first layer wires 38 and 39. The side wall spacers 43 are formed by depositing a silicon nitride film on both the bit lines BL and the first layer wires 38 and 39 by the CVD method and subsequently by anisotropically etching the silicon nitride film.

Figure 16:
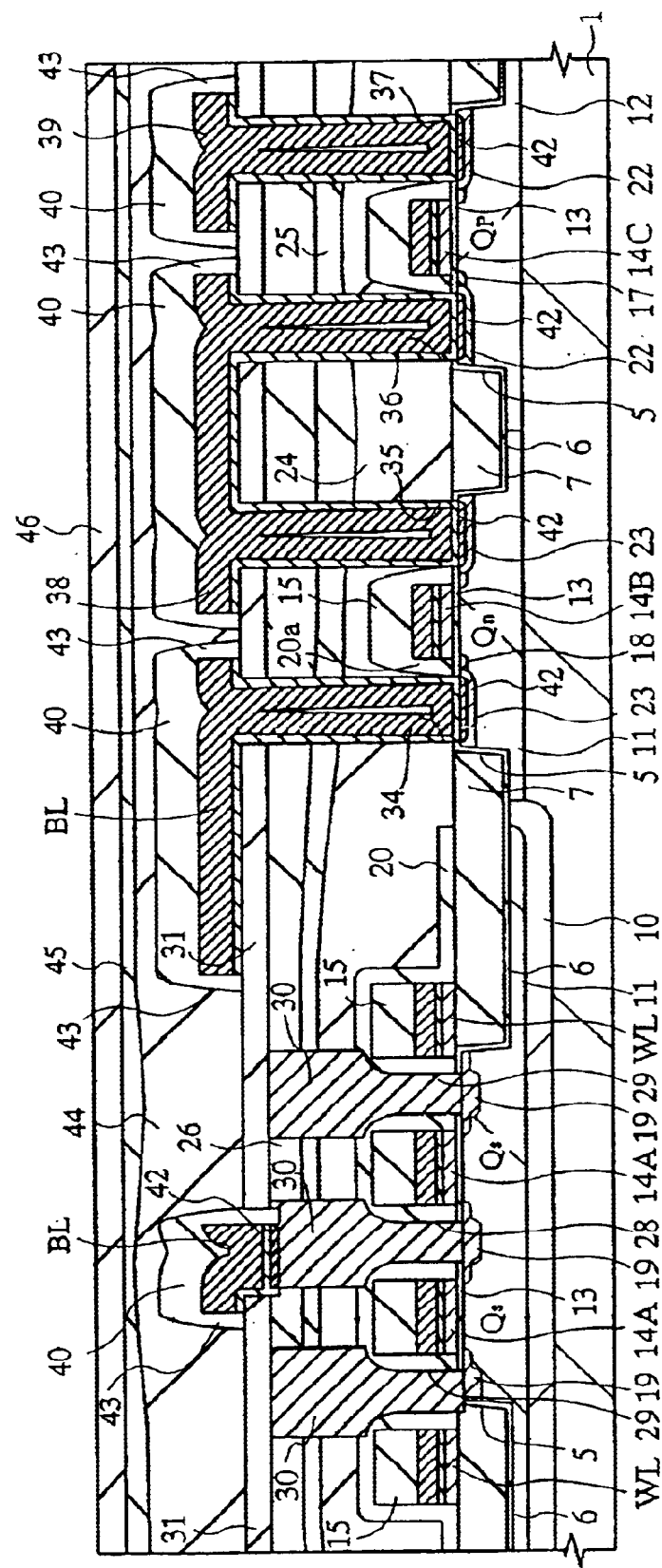

Thereafter, referring to FIG. 16, an about 300 nm thick SOG film 44 is spin-coated on the bit lines BL and the first layer wires 38 and 39. Then, the semiconductor substrate 1 is thermally treated at 800° C. for about 1 minute in order to sinter the SOG film 44. The SOG film 44 has highly reflowing characteristics and good gap-fill characteristics between minute distributing wires in comparison with a BPSG film, so that it can effectively fill gaps between the bit lines BL that are minute up to the resolution limit of photolithography. Additionally, since the SOG film 44 can be made to show a highly reflowing characteristics without requiring heat treatment at high temperature for a long period of time as required by the BPSG film, the SOG film 44 can effectively suppress any thermal diffusion of the impurities contained in the source and drain of the memory selection MISFET Qs formed in a lower layer of the bit lines BL and those of the MISFETs (n-channel type MISFET Qn and p-channel type MISFET Qp) of the peripheral circuit, thereby achieving a shallow bonding. Still additionally, the SOG film 44 can suppress any possible degradation of the metal (W film) constituting both the gate electrodes 14A (the word lines WL) and the gate electrodes 14B and 14C to improve high performance of the MISFETs constituting both the memory cells of the DRAM and the MISFETs of the peripheral circuit. Furthermore, the SOG film 44 can suppress any possible degradation of the Ti film, the TiN film and the W film constituting both the bit lines BL and the first layer wires 38 and 39 and achieve reduction of wiring resistance.

Then, after depositing an about 600 nm thick silicon oxide film 45 on the SOG film 44, surface of the silicon oxide film 45 is polished and planarized by the CMP method. The silicon oxide film 45 can typically be deposited by the plasma CVD method using ozone ($O_3$) and tetraethoxysilane (TEOS) as source gas, for example.

As described above, in this embodiment, the SOG film 44 having good planarized characteristics is coated even immediately after a film on the bit lines BL and the first layer distributing wires 38 and 39 is formed and then the silicon oxide film 45 deposited thereon is planarized by the CMP method. By this means, the gap-fill characteristics of the minute gaps between the adjacent bit lines BL can be improved and an insulating film on both the bit lines BL and the first layer distributing wires 38 and 39 can be smoothly planarized. Additionally, since the embodiment is not thermally treated at high temperature for a long time, the memory cells and the MISFETs constituting the peripheral circuit prevent a characteristics thereof from being degraded, thereby achieving high performance thereof and reducing electric resistance of the bit lines BL and the first layer distributing wires 38 and 39.

Then, an about 100 nm thick silicon oxide film 46 is deposited on the silicon oxide film 45 in order to repair minute damages formed after surface of the silicon oxide film 45 is polished by the CMP method. The silicon oxide film 46 can be deposited by the plasma CVD method using ozone ($O_3$) and tetraethoxysilane (TEOS) as source gas.

Figure 17:
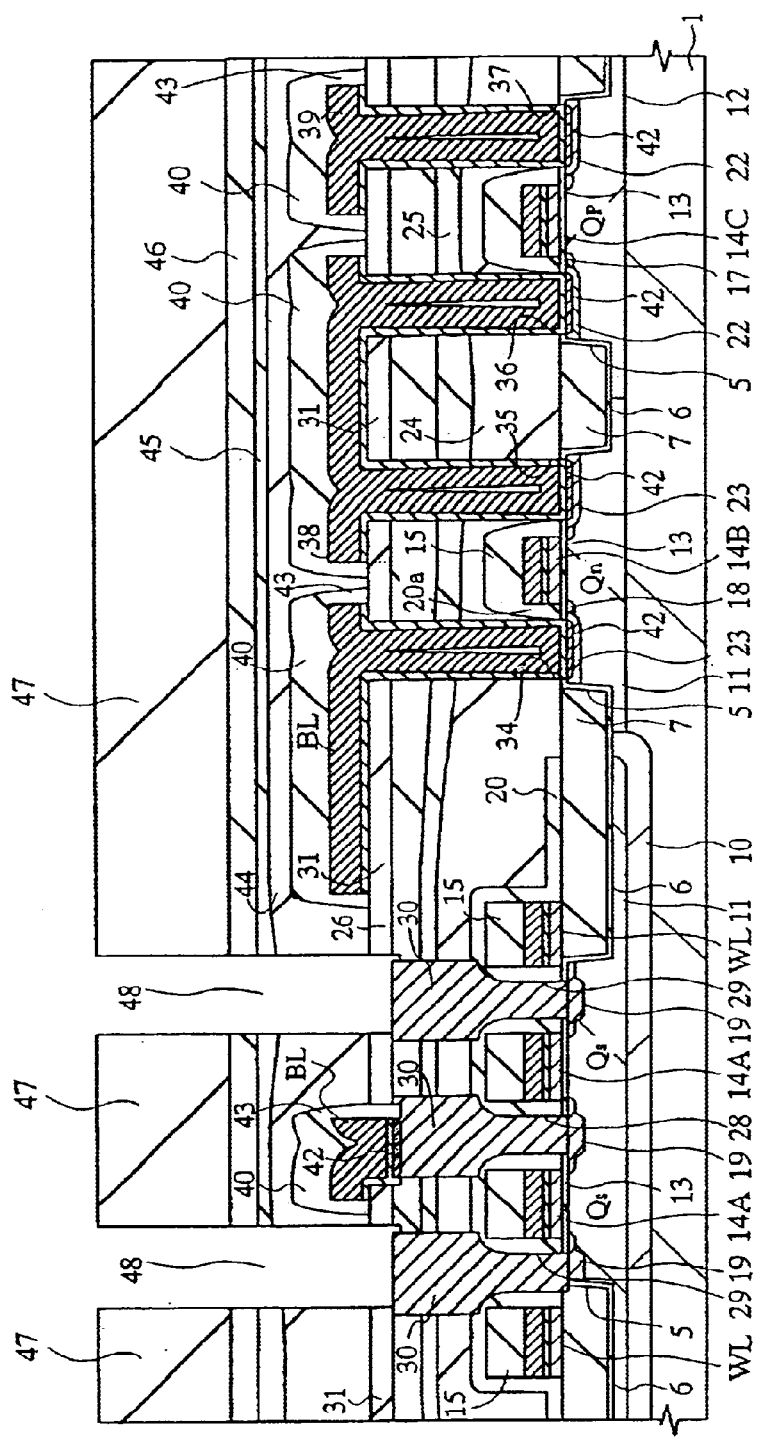

Next, referring to FIG. 17, the silicon oxide films 46, 45, the SOG film 44 and the silicon oxide film 31 in areas above the contact holes 29 are removed by dry etching using a photoresist film 47 as a mask, to produce through holes 48 extending to the surfaces of the plugs 30. This etching operation is conducted on the condition that the rate of etching the nitride film is decreased relative to the silicon oxide films 31, 45 and 46 and the SOG film 44, so that both the silicon nitride film 40 covering the bit lines BL and the side wall spacers 43 may not be stripped too deeply much if the through holes 48 and the bit lines BL are misaligned to some extent. By this arrangement, the through holes 48 are formed in a self-aligning manner relative to the bit lines BL.

Then, after removing the photoresist film 47, the dry etching residue and the photoresist residue on the surface of the plugs 30 exposed at the bottoms of the through holes 48 are removed by means of using an etching solution such as a mixed solution containing hydrofluoric acid and ammonium fluoride. At this time, although the SOG film 44 exposed on the outer walls of the through holes 48 are also attacked by the etching solution, the outer walls of the through holes 48 is not undercut by the wet etching operation because the rate of etching the SOG film 44 of hydrofluoric type etching solution is reduced by the above described sintering operation at about 800° C. Therefore, any risk of short-circuiting the plugs buried in the respective through holes 48 and the bit lines can be reliably prevented from arising in the next step. Additionally, since the plugs and the bit lines BL can be separated by a sufficient distance, any possible increase in the parasitic capacitance of the bit lines BL can be effectively suppressed.

Then, referring to FIG. 18, plugs 49 are formed in inside of the through holes 48. The plugs 49 are made of a metal compound such as titanium nitride film. The plugs 49 are used to suppress chemical reaction between reaction preventing film 50 and the plugs 30 when the reaction preventing film 50 is formed by a manner as described hereinafter. By this arrangement, the possible formation of at least one harmful substances between the plugs 30 and the plugs 49, such as obstructions having non-electrical conduction, is effectively suppressed to establish and maintain a good connection between the information storage capacity element and the memory cell selection MISFET Qs. The plugs 49 are formed by depositing a titanium nitride film on the silicon oxide film 46, for example, by the sputtering or CVD method and by etch-backing the deposited titanium nitride film and by putting the deposited titanium nitride film in the inside of the through holes 48. An etch-backing operation may polish the titanium nitride film by the CMP method.

Subsequently, referring to FIG. 19, a reaction preventing film 50 and a ruthenium (Ru) film 51 are deposited on the plugs 49 and the silicon oxide film 46. The reaction preventing film 50 may typically be made of ruthenium oxide film. The ruthenium film 51 is used to produce lower electrodes in a subsequent step. The reaction preventing film 50 may have a few to 50 nm in film thickness, while the ruthenium film 51 may have about 0.5 µm in film thickness. Note, however, that a film thickness value of 0.5 µm defines height of the lower electrodes as described hereinafter and hence can be regulated as a function of the surface area or the capacitance required for the lower electrodes. The reaction preventing film 50 can be formed by the sputtering or CVD method.

The ruthenium film 51 can be deposited by the sputtering method using ruthenium as target. Some of the requirements to be met for the sputtering operation include the following; 200 mm in a diameter of the target electrode, 900 W in power consumption rate for generating plasma for the sputtering operation, 300° C. in substrate temperature during the sputtering operation, argon (Ar) of sputtering plasma gas, and 0.5 Pa of gas pressure. Under these conditions, the ruthenium film is formed by sputtering at a sputtering rate (film forming rate) of about 140 nm/min.

As described above, since the ruthenium film 51 is formed by sputtering at a relatively low sputtering rate of about 140 nm/min, it comes to show a crystal structure oriented in a particular plane bearing, or (002) plane for example. Probably due to the fact that the crystal structure of the ruthenium oxide film 51 is oriented in a particular plane bearing (002), crystal of tantalum oxide is formed already during the process of depositing the tantalum oxide film as described hereinafter (in an as-deposited state). A sort of hetero-epitaxial growth is ocrruing there. Tantalum oxide crystal formed by hetero-epitaxial growth can reduce the temperature for thermally treating the tantalum oxide film.

While the rate of forming the ruthenium film 51 is as low as about 140 nm/min in the above description, it is only necessary to reduce the film forming rate to less than 200 nm/min by selecting appropriate film following conditions below.

Furthermore, while the ruthenium film 51 is formed by sputtering in the above description, it may alternatively be formed by the CVD method using organic ruthenium gas such as bis-ethylcyclopentadienilruthenium ($Ru(C_2H_5C_5H_4)_2$), bis-cyclopentadienilruthenium ($Ru(C_2H_5)_2$), bis-methylcyclopentadienilruthenium ($Ru(CH_3C_5H_4)_2$) tris-dimethylheptandionateruthenium ($Ru(C_9H_{15}O_2)_3$), tris-trimethylheptandionateruthenium ($Ru(C_{10}H_{17}O_2)_3$) and tris-dipivaloilmethanateruthenium($Ru(C_{11}H_{19}O_2)_3$). Carrier gas (nitrogen, argon or the like) made to pass through a ceramic object impregnated with any of the above gaseous compounds is then introduced into a reaction chamber and thermally decomposed for the film forming process.

While the metal crystal film is described above in terms of ruthenium, the ruthenium film 51 may be replaced by a metal film having a crystal structures oriented in a particular plane bearing and typically made of tungsten, iridium, platinum or oxide of any of them.

Then, referring to FIG. 20, a photoresist film 52 is formed on the ruthenium film 51 and subsequently the ruthenium film 51 and the reaction preventing film 50 are removed by the etching method using the photoresist film 52 as a mask, for example, RIE (reactive ion etching) method. As a result, lower electrodes 54 comprising the reaction preventing film 53 and the ruthenium film 51 are produced. The reaction preventing film 53 is prepared to prevent oxygen from entering in a subsequent heat treatment process to be conducted on the capacity insulationg film in an oxidizing atmosphere, as described hereinafter.

Figure 21:
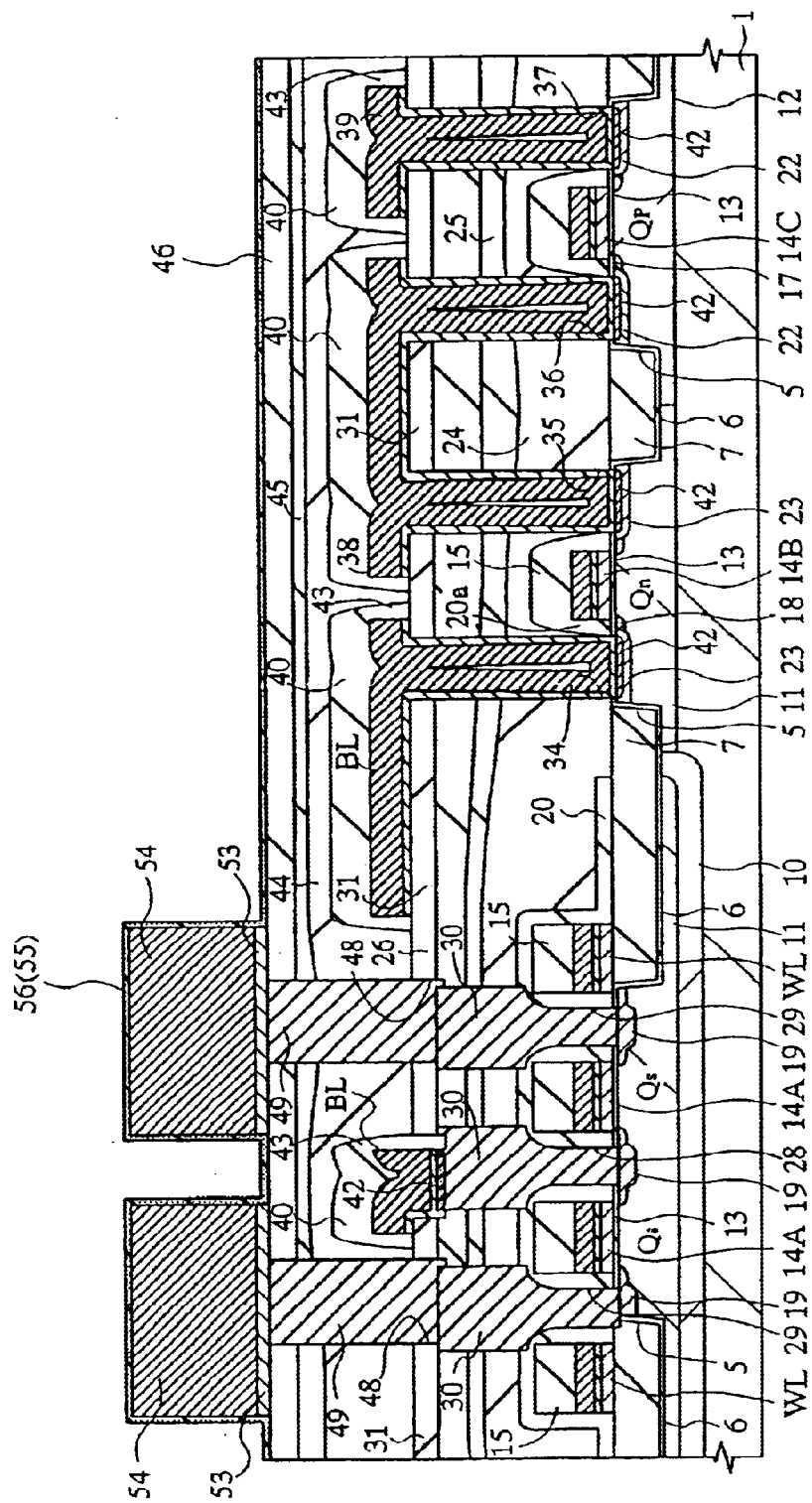

Then, referring to FIG. 21, after removing the photoresist film 52, an about 10 nm thick tantalum film 55 is deposited on the entire surface of the semiconductor substrate 1. The tantalum film 55 can be deposited by thermal CVD, using, for example, gas containing pentaetoxytantalum (Ta($C_2H_5O)_5$) as source gas at 450 to 500° C. under low pressure (e.g., 400 mTorr).

Thus, the tantalum oxide film 55 can be deposited by thermal CVD to make it operate advantageously for step coverage. Additionally, the CVD operation conducted at relatively high temperature between 450 and 500° C. can effectively reduce the impurities contained in the tantalum oxide film 55 such as carbon compounds to consequently reduce the crystallization temperature of the tantalum oxide film 55, as described hereinafter.

Figure 22A:
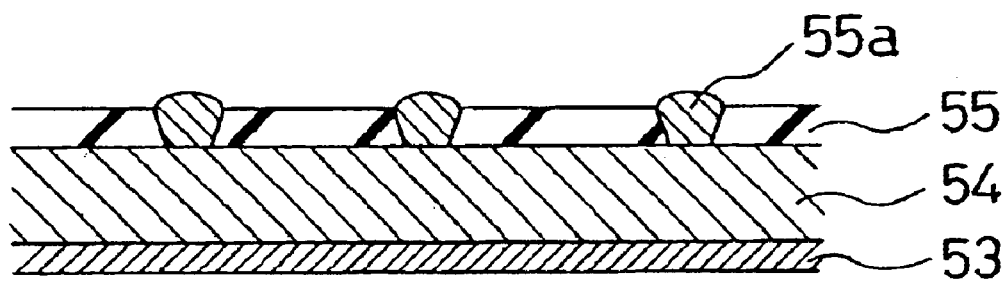

Note that the tantalum oxide film 55 formed in this step is an amorphous thin film containing crystal of tantalum oxide 55a as shown in FIG. 22(a). As pointed out above, crystal of tantalum oxide 55a is formed in an as-deposited state probably because the tantalum oxide film 55 shows a sort of epitaxial growth due to the fact that the ruthenium film 51 that makes the lower electrodes 54 contain crystal that is oriented in a particular plane bearing. Due to the existence of crystal of tantalum oxide 55a in an as-deposited state, an excellent polycrystalline tantalum oxide film 56 can be obtained if the temperature of thermally treating the tantalum oxide film 55 is relatively low.

The tantalum oxide film 55 may alternatively be formed by using a mixture gas of pentaalkyltantalum gas such as Ta($C_2H_5)_5$ and oxygen as source gas.

Figure 22B:
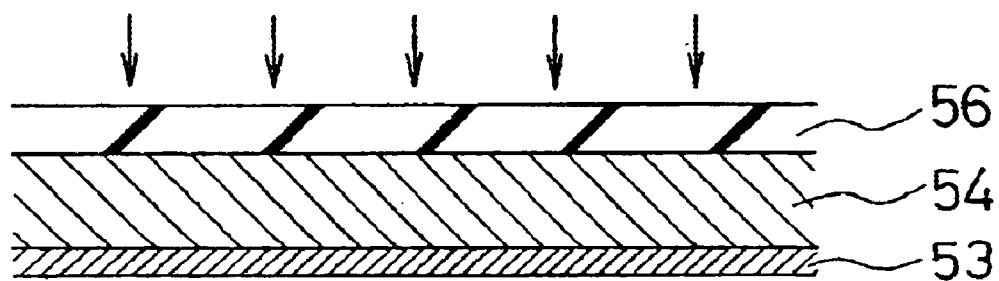

Thereafter, the tantalum oxide film 55 is thermally treated to produce a polycrystalline tantalum oxide film 56 (FIG. 22(b)). The heat treatment of the tantalum oxide film 55 is conducted under a condition selected from the first condition of processing at temperature lower than 700° C. in an oxygen ($O_2$) atmosphere, the second condition of processing at temperature lower than 600° C. in an ozone ($O_3$) atmosphere, the third condition of processing at temperature between 600 and 650° C. in an dinitrogen monoxide ($N_2O$) gas atmosphere, the fourth condition of conducting a first processing operation at temperature lower than 700° C. in a non-oxidizing atmosphere and subsequently a second processing operation at temperature lower than 600° C. in an atmosphere containing at least ozone or the fifth condition of conducting a second processing operation at temperature lower than 600° C. in an atmosphere containing at least ozone and subsequently a first processing operation at temperature lower than 700° C. in a non-oxidizing atmosphere.

As pointed out above, the tantalum oxide film 55 may be thermally treated either in a single step of crystallizing the tantalum oxide film 55 and thermally treating it with oxygen in an oxygen atmosphere at the same time (the first through third conditions) or in two steps of crystallizing the tantalum oxide film 55 first and subsequently thermally treating it (or vice versa) (the fourth and fifth conditions). The heat treatment using oxygen operates as means for supplying oxygen to eliminate the state of oxygen deficiency of the polycrystalline tantalum oxide film 56 that arises as a result of crystallization. The heat treatment temperature may vary depending on the oxidizing potential of oxidizing gas in the oxygen atmosphere. More specifically, dinitrogen monoxide allows the use of lower treatment temperature than oxygen but ozone allows the use of lower treatment temperature than dinitrogne monoxide. Ozone will be used in the following description of the embodiments.

In a crystallizing process using ozone, the heat treatment can be conducted at temperature under 600° C. as pointed out above. As a result of a series of studies carried out by the inventors of the present invention, it was found that the crystallizing process can successfully proceed treatment and the state of oxygen deficiency can be satisfactorily eliminated if temperature lower than 500° C. is used for the heat because, in addition to the use of ozone, the ruthenium film contained in the lower electrodes 54 is made of crystal that is oriented in the particular plane bearing (002) and the tantalum oxide film 55 formed on the surface thereof contains crystal of tantalum oxide 55a as pointed out above.

Thus, owing to the fact that the tantalum oxide film 55 that is, if partly, in an amorphous state is crystallized to produce a polycrystalline tantalum oxide film 56, it is possible to form a capacity insulating film showing a high dielectric constant and increase the accumulated electric charge of the information storage capacity element. Then, the information storage capacity element can be adapted to the effort of down-sizing the DRAM.

Additionally, since the tantalum oxide film 55 can be crystallized at such low temperature to produce polycrystalline tantalum oxide film 56, it is possible to suppress degradation by heat of the $TiSi_2$ layer 42.

Still additionally, since the polycrystalline tantalum oxide film 56 can be obtained at low temperature, it is possible to suppress oxidation of the ruthenium of the lower electrodes 54. More specifically, if an oxide film is formed on the surface of the lower electrodes 54 after depositing the tantalum oxide film 55, stress can arise in the polycrystalline tantalum oxide film 56 due to the expansion of the volume of the oxide film and consequently give rise to leak currents. However, with the arrangement of this embodiment, there is no risk of generating leak currents because no such oxide film is formed. If, on the other hand, the lower electrodes 54 is made of a polycrystalline silicon film, a silicon oxide film can be formed on the surface of the polycrystalline silicon film when the tantalum oxide film 55 is crystallized to take a substantial part of the capacity insulating film and reduce the accumulated electric charge of the information storage capacity element. However, with the arrangement of this embodiment, no oxide film is formed along the interface of the lower electrodes 54 and the polycrystalline tantalum oxide film 56 so that any possible reduction of the accumulated electric charge can be effectively suppressed.

It is also possible to form an oxide film of the metal of the lower electrodes 54 such as ruthenium oxide film on the surface of the lower electrodes 54. If the lower electrodes 54 are made of iridium, an iridium oxide may be formed on the surface of the lower electrodes 54. Such a thin ruthenium oxide or iridium oxide film can be formed by the sputtering, CVD or oxidation method. With this arrangement of forming a ruthenium oxide film on the lower electrodes 54 in advance, the lower electrodes 54 are in an oxidized state and hence they are not oxidized any further during the process of crystallizing the tantalum oxide film 55 so that any unnecessary stress is generated in the polycrystalline tantalum oxide film 56 after the crystallizing process and hence the leak current, if generated, will be reduced. Note that, since tantalum oxide is electroconductive, the ruthenium oxide film does not significantly increase the film thickness of the capacity insulating film and hence the accumulated electric charge of the information storage capacity element is note reduced.

Additionally, since the reaction preventing film 53 of ruthenium oxide is formed in advance in a manner as described above, no oxygen will pass through the tantalum oxide film 55 and the lower electrodes 54 to get to the plugs 49 in the heat treatment process and any possible reaction of ruthenium contained in the lower electrodes 54 and nitrogen or titanium of the plugs 49, can be suppressed. As a result, the connection resistance between the plugs 49 and the lower electrodes 54 can be held low to improve the reliability of the electric connection of the plugs 49 and the lower electrodes 54.

The crystal structure of the polycrystalline tantalum oxide film 56 formed as a result of the heat treatment reflects the crystal structure of ruthenium contained in the underlying lower electrodes 54. More specifically, the polycrystalline tantalum oxide film 56 is made of tantalum oxide crystal having a crystal structure oriented in a particular plane bearing same as the crystal structure of ruthenium film. The plane bearing of orientation is typically (002) plane, which is same as the plane bearing of ruthenium crystal of the lower electrodes 54. With this embodiment, both the ruthenium crystal of the lower electrodes 54 and the crystal of polycrystalline tantalum oxide film 56 have a crystal structure of hexagonal system and oriented in the (002) plane.

Figure 23:
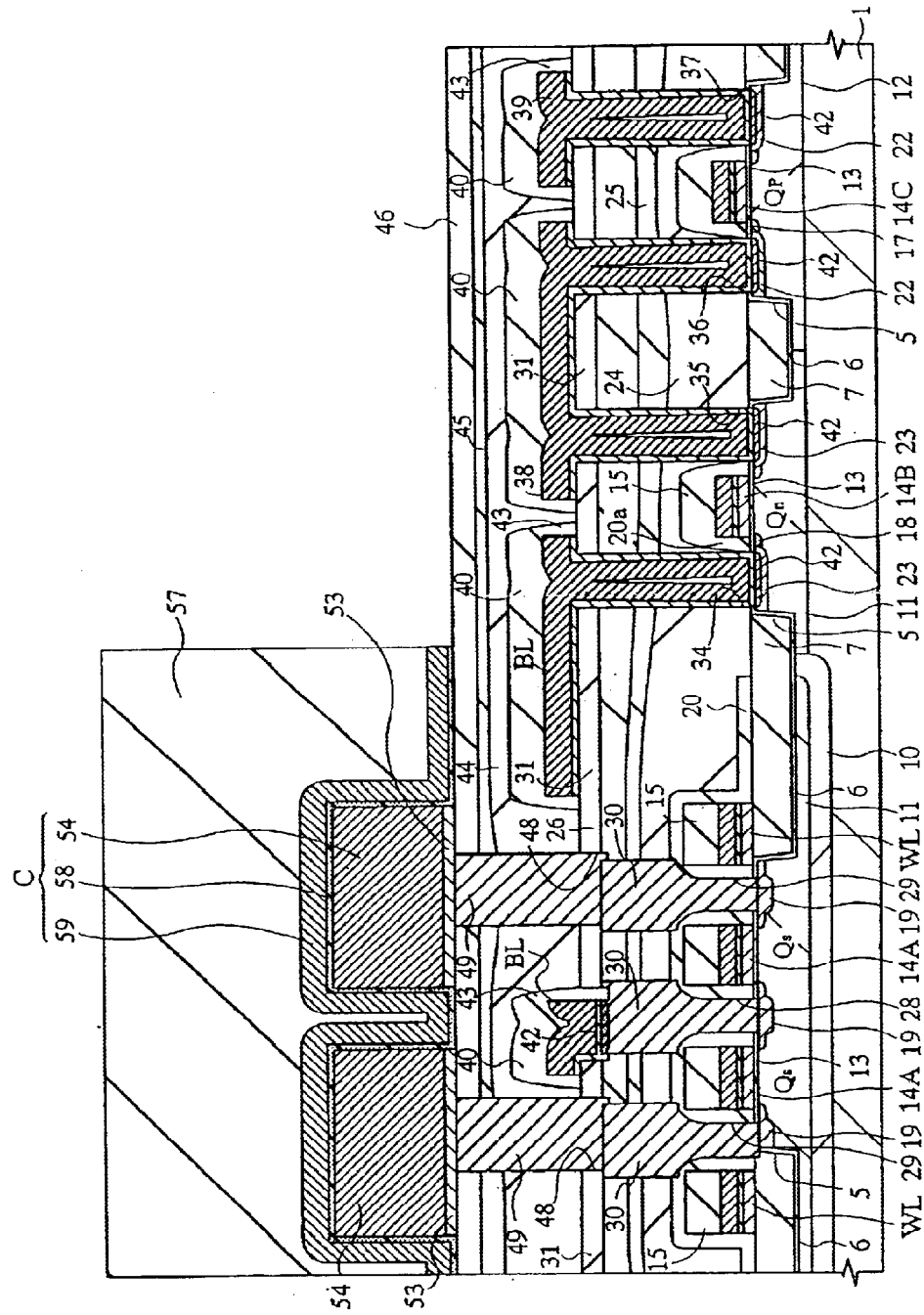

Thereafter, a titanium nitride film is formed by deposition on the polycrystalline tantalum oxide film 56 and a photoresist film 57 is formed on the titanium nitride film as shown in FIG. 23. Then, the titanium nitride film and the polycrystalline tantalum oxide film 56 are etched to produce capacity insulating film 58 and upper electrodes 59 by etching, using the photoresist film 57 as mask. The titanium nitride film can be deposited by the CVD method. Thus, an information storage capacity element C is formed by the lower electrodes 54 of ruthenium, the capacity insulating film 58 of polycrystalline tantalum oxide film and the upper electrodes 59 of titanium nitride. As a result, the process of preparing a memory cell of the DRAM comprising a memory cell selection MISFET Qs and an information storage capacity element C connected thereto in series is completed.

The titanium nitride film of the upper electrodes 59 may be replaced by ruthenium oxide film, ruthenium film or tungsten film.

Figure 24:
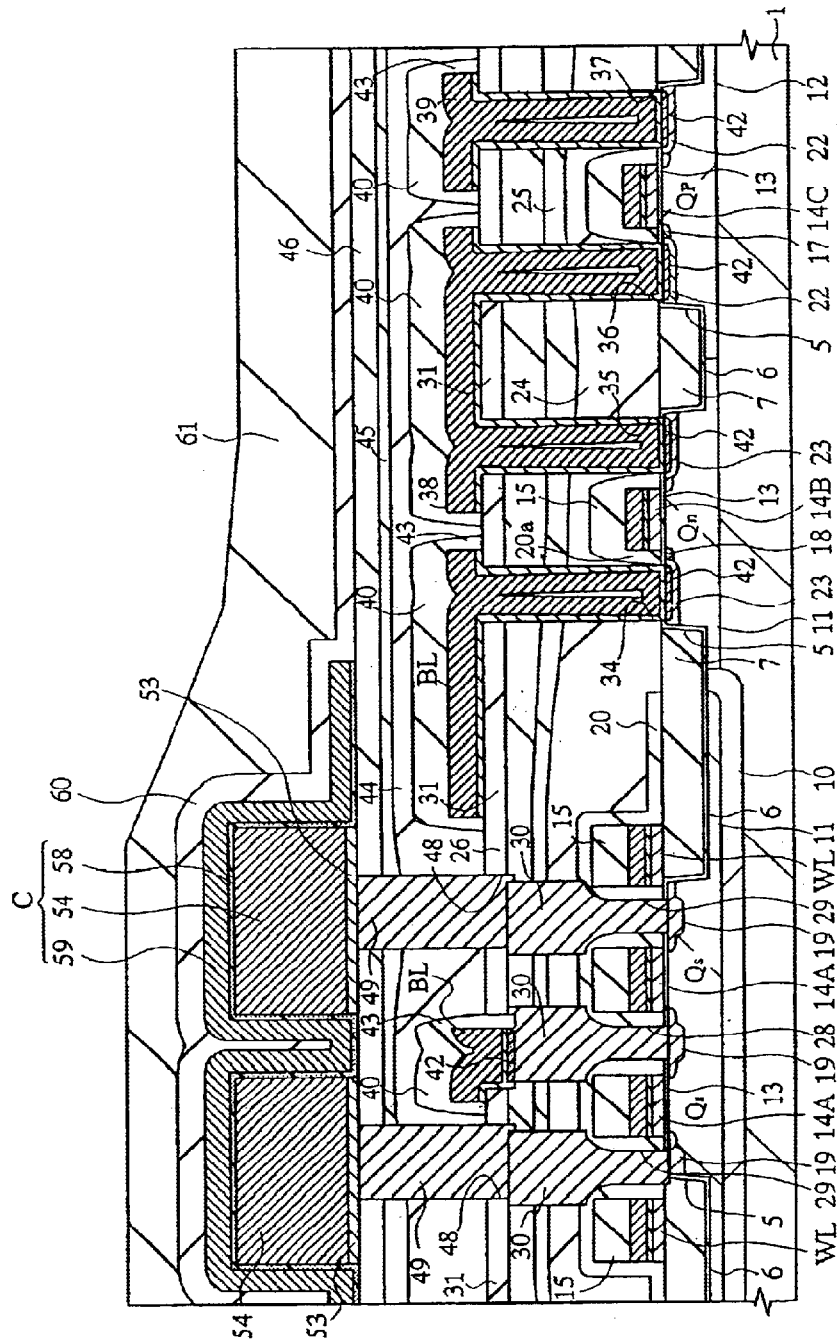

Then, referring to FIG. 24, after removing the photoresist film 57, an about 40 nm thick silicon oxide film 60 is deposited on the information storage capacity element C by the plasma CVD method using ozone ($O_3$) and tetraethoxysilane (TEOS) as source gas. Then, an SOG film 61 is applied to planarize the region where the memory cells are formed and reduce the step between the region and that of the peripheral circuit. Since the capacity insulating film 58 of the DRAM of this embodiment is made of polycrystalline tantalum oxide film showing a high dielectric constant, it is not necessary to form lower electrodes 54 having a high profile. Therefore, it is possible to reduce the step between the memory cell region and the peripheral circuit region only by a single SOG film 61. This means that this embodiment is free from the use of complex steps for eliminating the step between the memory cell region and the peripheral circuit region to reduce the number of manufacturing steps and simplify the operation of the related steps.

Figure 25:
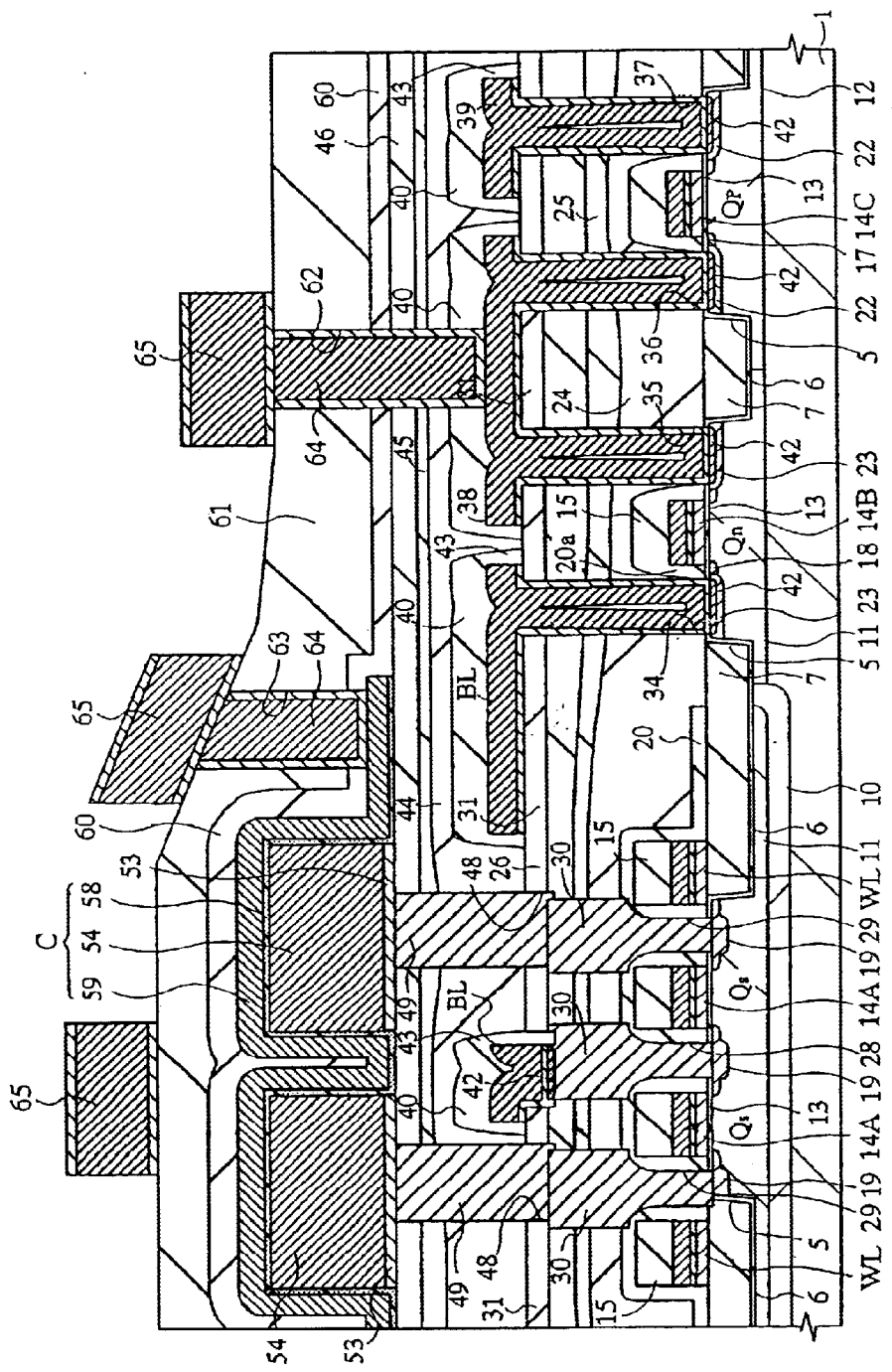

Then, referring to FIG. 25, the SOG film 61, the silicon oxide films 60, 53, the silicon oxide film 46, the silicon oxide film 45, the SOG film 44 and the silicon nitride film 40 on the first layer wires 58 of the peripheral circuit are partly removed by the dry-etching method using a photoresist film as a mask, to produce a through hole 62. Similarly, the SOG film 61 and the silicon oxide film 60 on the upper electrodes 59 are partly removed also by dry etching to produce a through hole 63. Subsequently, plus 64 are formed inside the through holes 62 and 63 and then second layer wires 65 are formed on the SOG film 61. The plugs 64 are formed by depositing an about 100 nm thick TiN film on the SOG film 61 and then an about 500 nm thick W film thereon by the CVD method and subsequently etching back the films so as to make them to be left only in the through holes 62, 63. The second layer wires 65 are formed by depositing an about 50 nm thick TiN film, an about 500 nm thick Al (aluminum) film and an about 50 nm thick Ti film sequentially on the SOG film 61 and subsequently patterning the films by dry etching, using a photoresist film as mask.

Thereafter, although not shown, third layer wires are formed thereon with an interlay insulating film interposed therebetween and a passivation film comprising a silicon oxide film and a silicon nitride film is deposited thereon. Now, the embodiment of DRAM is substantially completed.

The third layer wires and the plugs connecting them can be formed as in the case of the second layer wires and the related plugs. The interlayer insulating film may be formed typically by sequentially depositing an about 300 nm thick silicon oxide film, an about 400 nm thick SOG film and an about 300 nm thick silicon oxide film. A silicon oxide film can be formed by deposition and using ozone ($O_3$) and tetraethoxysilane (TEOS) as source gas.

With this embodiment, since the ruthenium film of the lower electrodes 54 is made of crystal oriented in a particular plane bearing such as the (002) plane, the tantalum oxide film 55 can be crystallized at low temperature to suppress both thermal degradation of the $TiSi_2$ layer 42 and oxidation of the surface of the lower electrodes 54. As a result, it is possible to hold the connection resistance of the bit lines BL and the wires 38, 39 of the peripheral circuit region low and increase the accumulated electric charge of the information storage capacity element C so as to improve the reliability of the capacitor.

Figure 26:
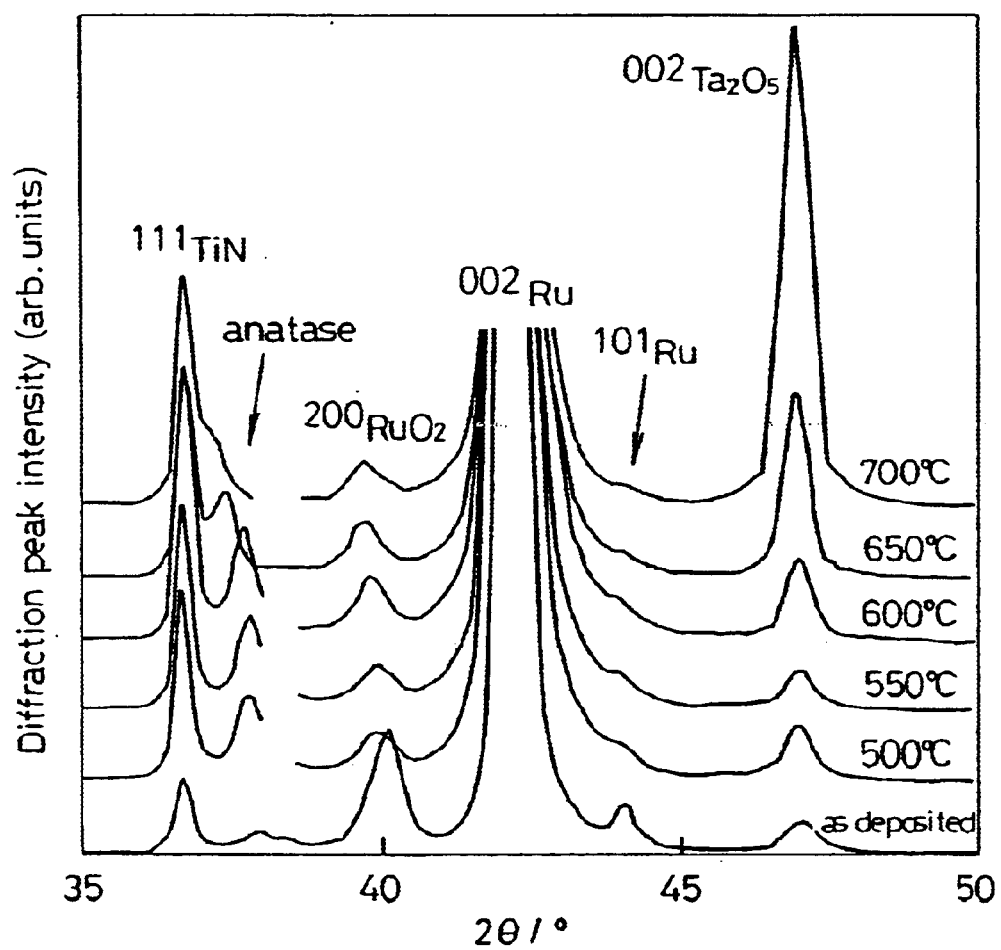
FIG. 26 is a graph showing the X-ray diffraction data of the polycrystalline tantalum oxide film of the DRAM of Embodiment 1.
Figure 27:
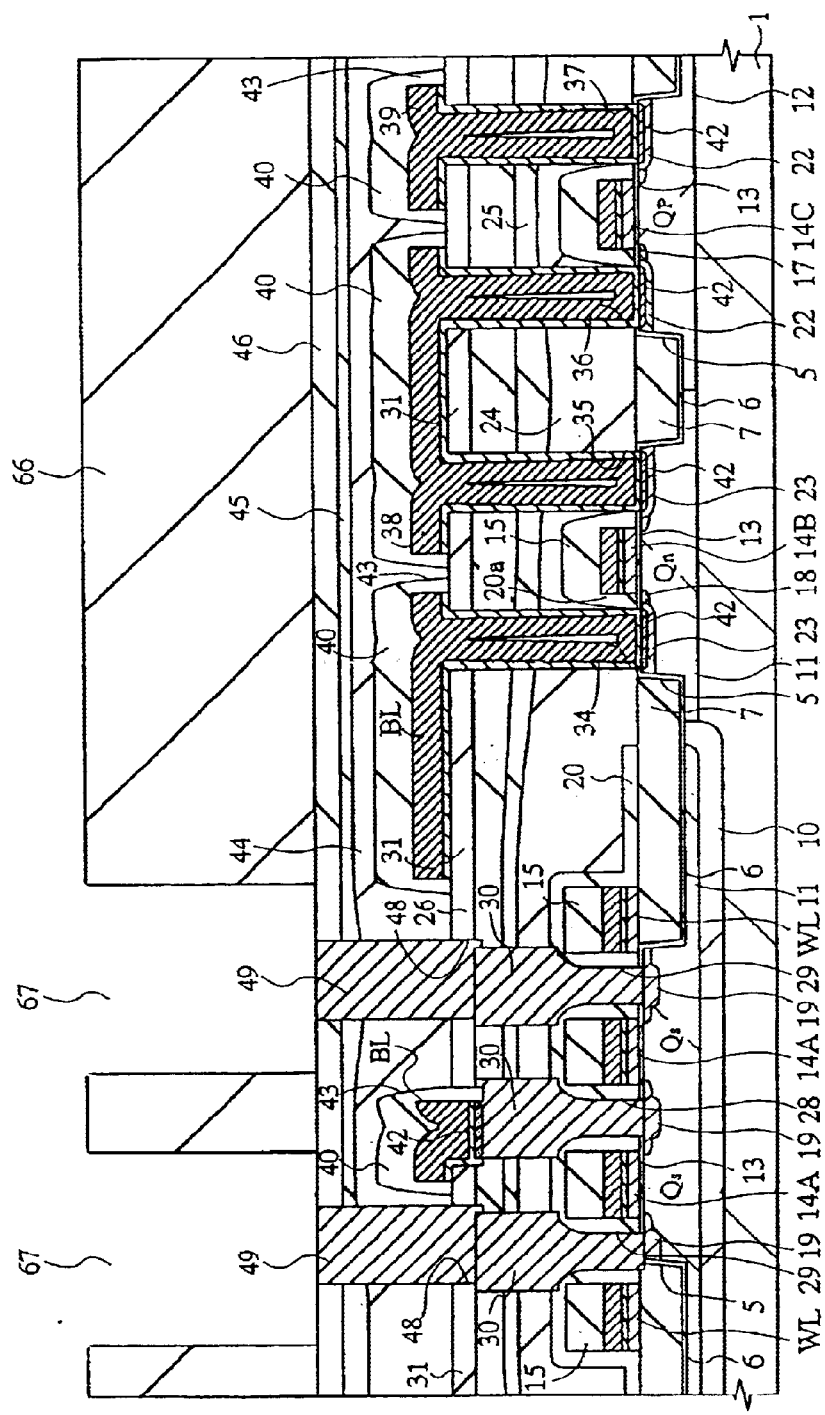
FIGS. 27 through 31 are schematic cross sectional views of the DRAM of Embodiment 2 shown in the order of the steps of manufacturing it.

FIG. 26 summarily shows the X-ray diffraction data of the tantalum oxide film 55 of this embodiment formed by deposition on the lower electrodes 54 comprising the ruthenium film 51 obtained by changing the heat treatment temperature. As seen from the graph, a peak appears for crystal tantalum oxide in the tantalum oxide film in the as-deposited state before the heat treatment and desirable crystal of tantalum oxide is formed as a result of a heat treatment below 700° C. It is also seen that the peaks of the (002) plane of the underlying ruthenium play a dominant role and also the (002) plane of the polycrystalline tantalum oxide film takes a dominant role in the peaks of the film.

Embodiment 2

FIGS. 27 through 31 are schematic cross sectional views of the DRAM of Embodiment 2 shown in the order of the steps of manufacturing it.

The DRAM of this second embodiment is identical with the first embodiment illustrated in FIGS. 1 and 2 in terms of circuit configuration and plan view. The cross sectional views are also same as their counterparts of the first embodiment except the structure of the information storage capacity element C. Therefore, this embodiment will be described only in terms of the differences between the two embodiments and the components that are common to the two embodiments will not be described any further.

The method of manufacturing Embodiment 2 is identical with that of manufacturing Embodiment 1 down to the step of FIG. 18. Thereafter, referring to FIG. 27, an insulating film 66 is formed and then grooves 67 are formed in the film 66 until the plugs 49 become exposed. The insulating film 66 is typically formed by the plasma CVD method using ozone ($O_3$) and tetraethoxysilane (TEOS) as source gas. The grooves 67 are formed by the etching method using a photoresist film as mask.

Figure 28:
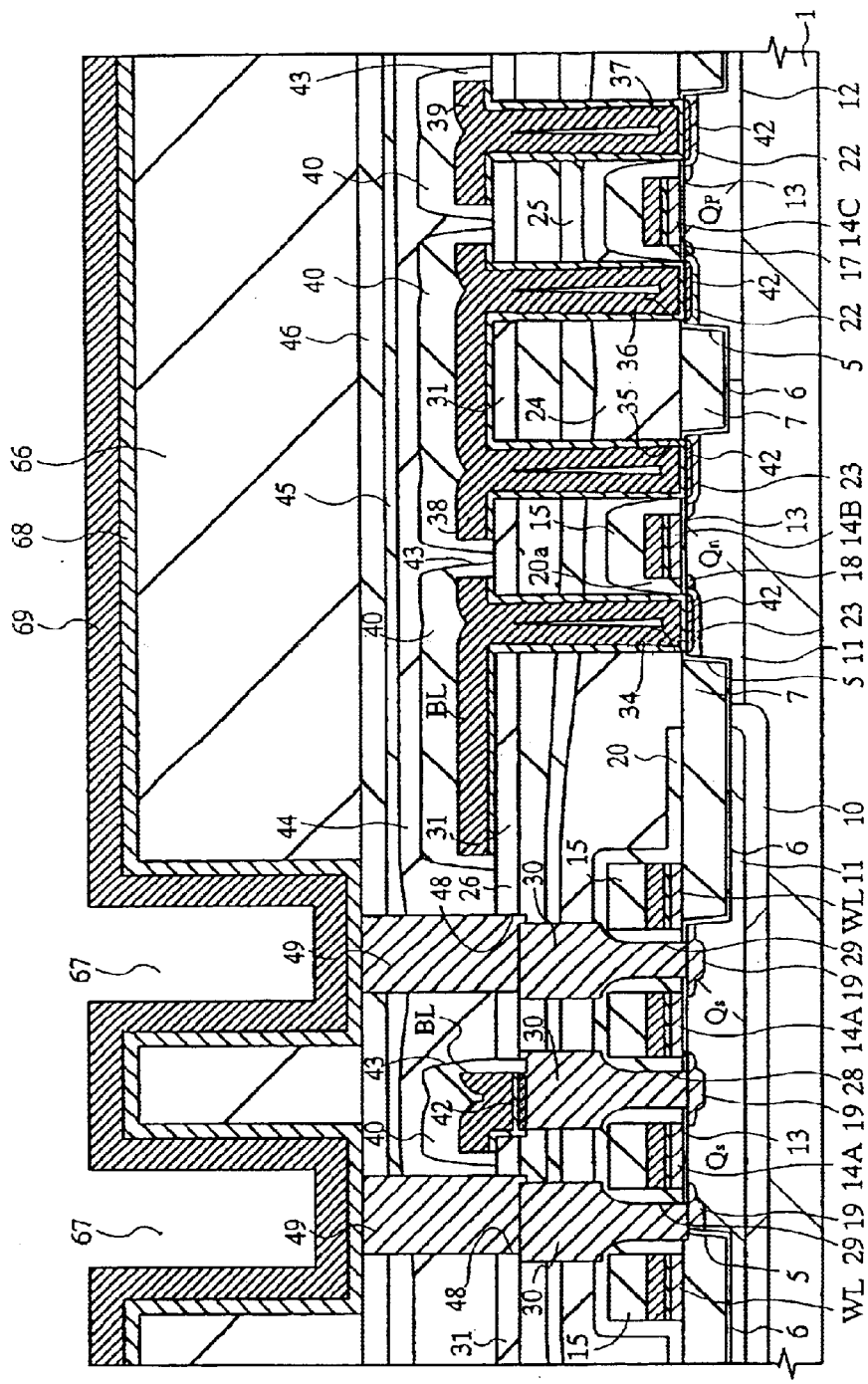

Then, referring to FIG. 28, a reaction preventing film 68 and a ruthenium film 69 are sequentially deposited in a manner as described above by referring to Embodiment 1.

Figure 29:
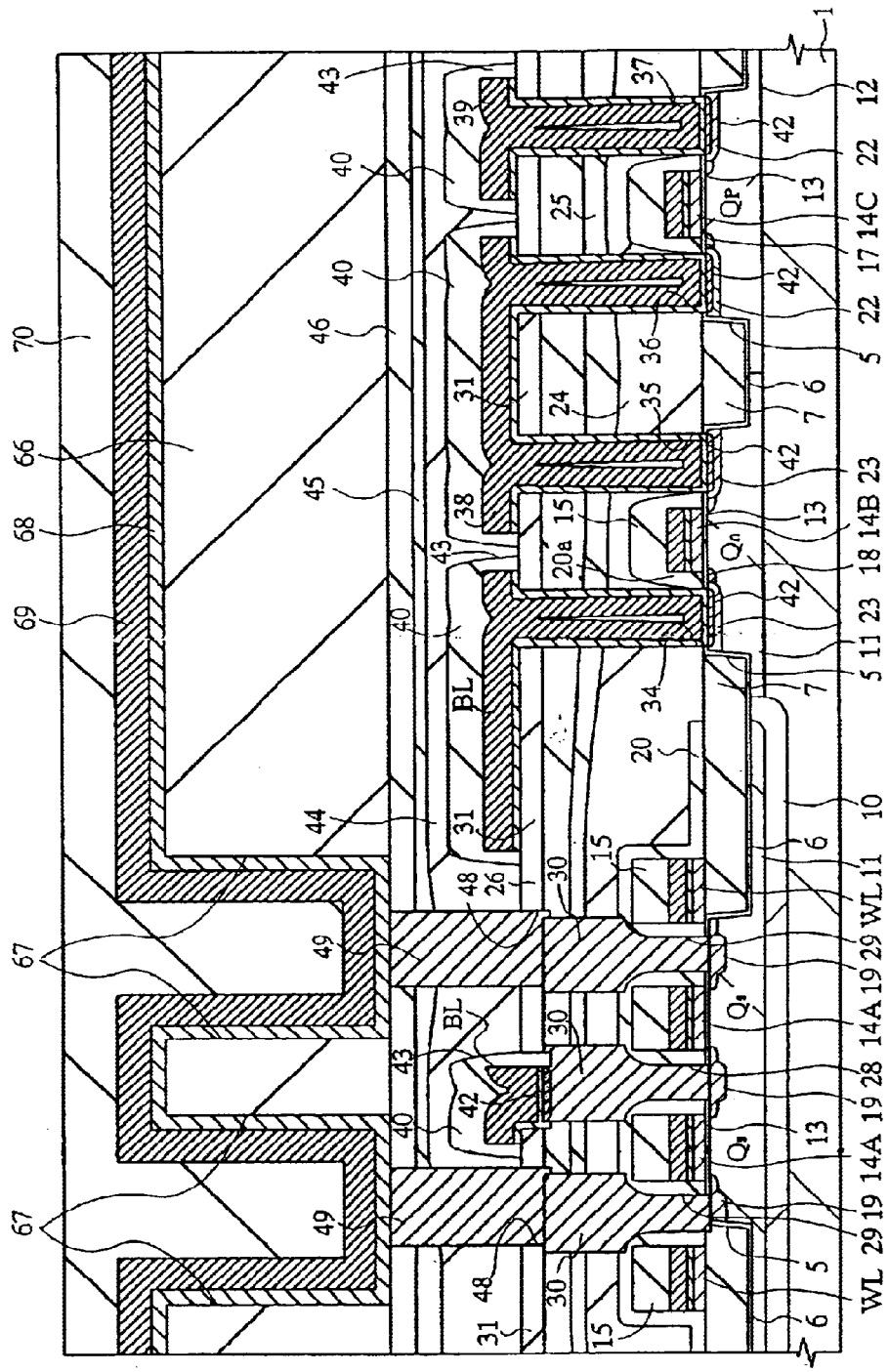

Thereafter, referring to FIG. 29, an insulating film 70 is formed on the entire surface of the semiconductor substrate 1 by deposition. The insulating film 70 is preferably an SOG film in view of that such a film can be buried into the grooves 67 effectively and shows a favorable etching selectivity relative to the insulating film 66.

Figure 30:
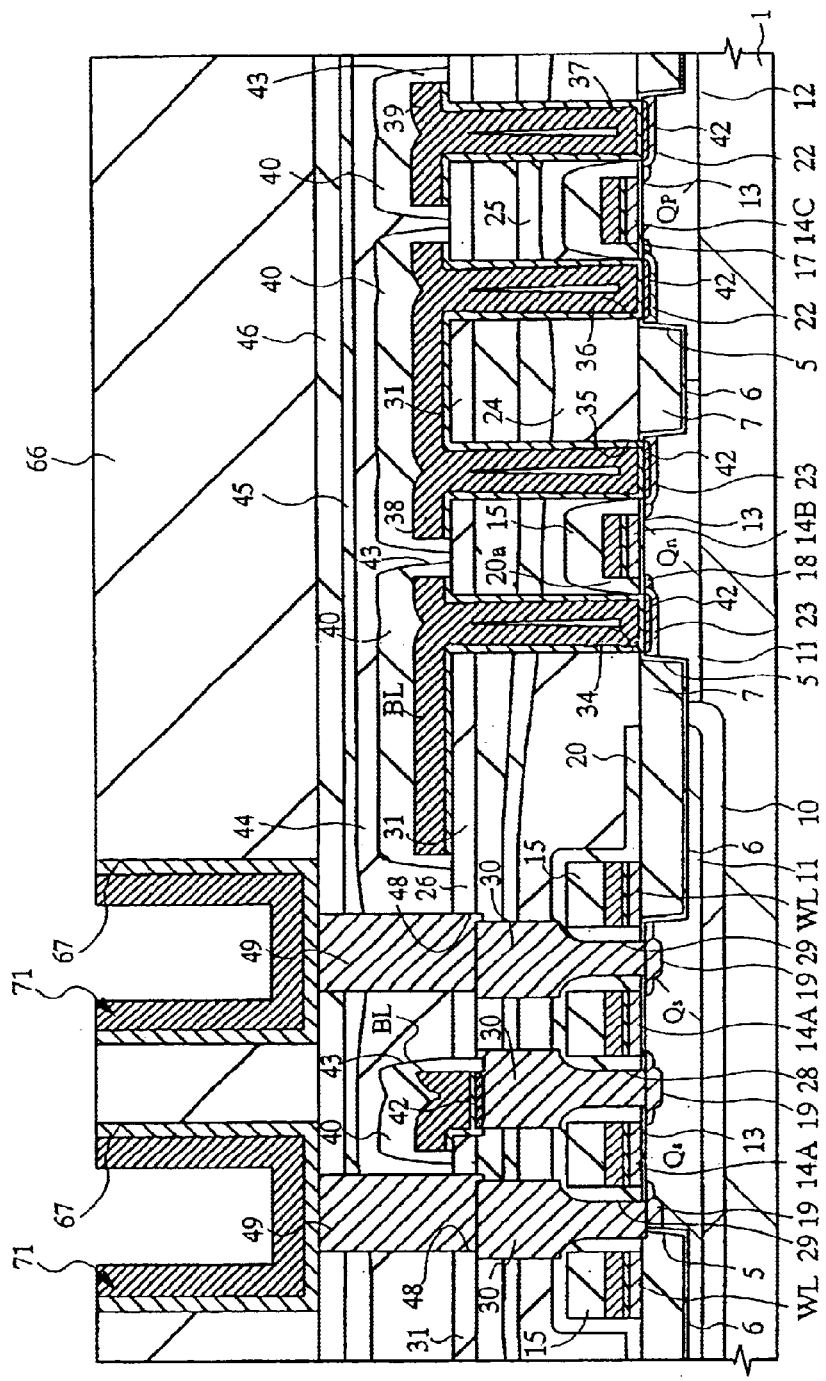

Then, referring to FIG. 30, the reaction preventing film 68 and the ruthenium film 69 on the insulating film 66 are removed except the parts thereof in the regions of the insulating film 70 and the grooves 67 typically by means of an etching back technique or a CMP technique. The insulating film 70 remaining in the grooves 67 can be etched back and removed. As a result, the lower electrodes 11 comprising the reaction preventing film 68 and the ruthenium film 69 is produced.

Figure 31:
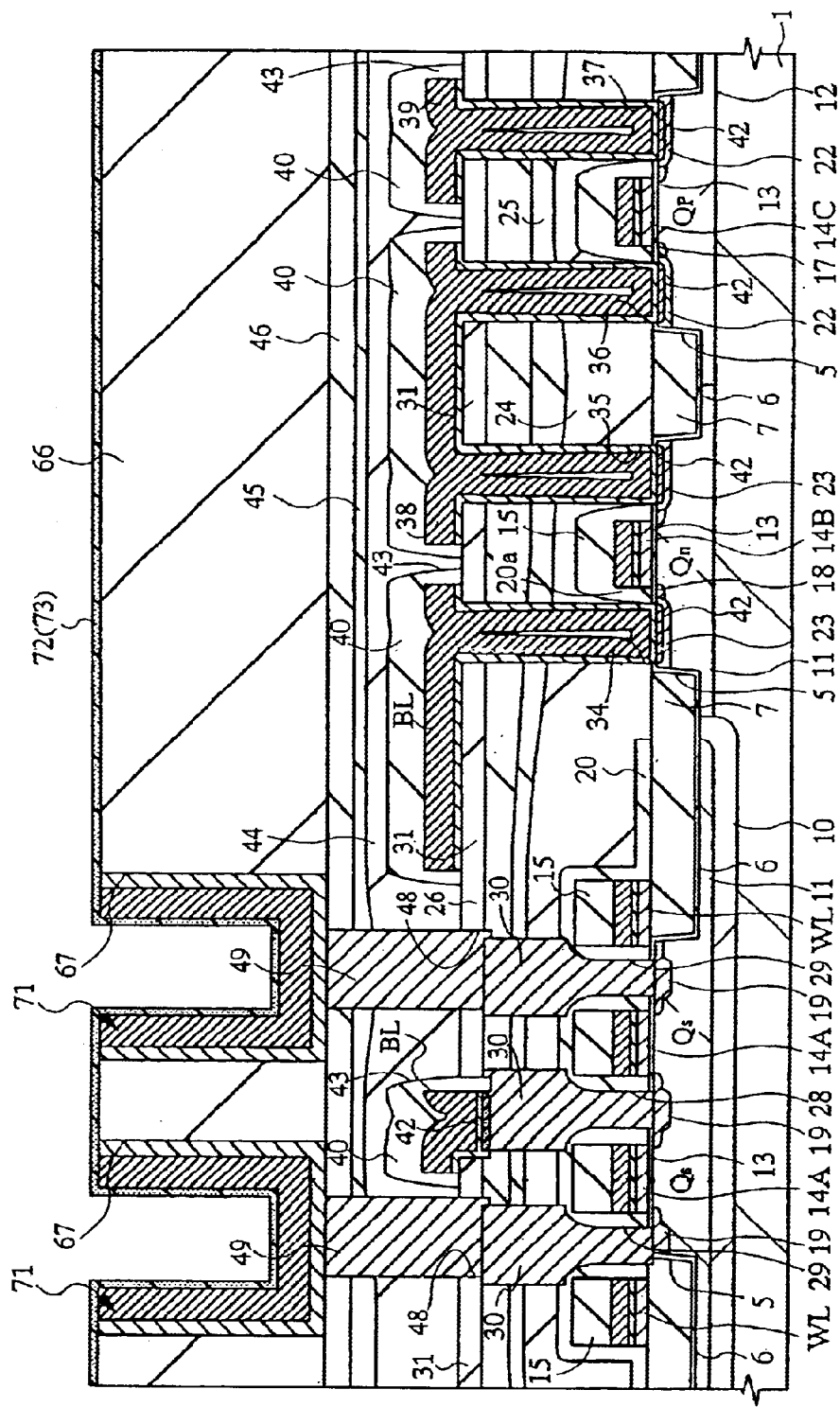

Thereafter, referring to FIG. 31, a tantalum oxide film 72 is formed on the entire surface of the semiconductor substrate 1 by deposition as in the case of Embodiment 1.

Then, also as in the case of Embodiment 1, the tantalum oxide film 72 is thermally treated for crystallization to produce a polycrystalline tantalum oxide film 73. All the remaining steps are same as their counterparts of the Embodiment 1.

The DRAM of this second embodiment provides an advantage that the lower electrodes 71 can be realized in a cylindrical form having an upper opening to increase the surface area thereof and hence the accumulated electric charge of the information storage capacity element C. Additionally, the insulating film 66 formed in the peripheral current region can effectively prevent any step from appearing between the memory cell region and the peripheral circuit region to reduce the risk of occurrence of broken second layer wires and improve the margin in the photolithography processes.

Embodiment 3

FIGS. 32 through 39 are schematic cross sectional views of the DRAM of Embodiment 3 shown in the order of the steps of manufacturing it. FIGS. 32 through 39 show only the region of the information storage capacity element C because all the other members of the DRAM are identical with their counterparts of Embodiment 1.

Since the DRAM of this third embodiment is identical with the first embodiment illustrated in FIGS. 1 and 2 except the region of the information storage capacity element C, only the information storage capacity element C will be described below.

Figure 20:
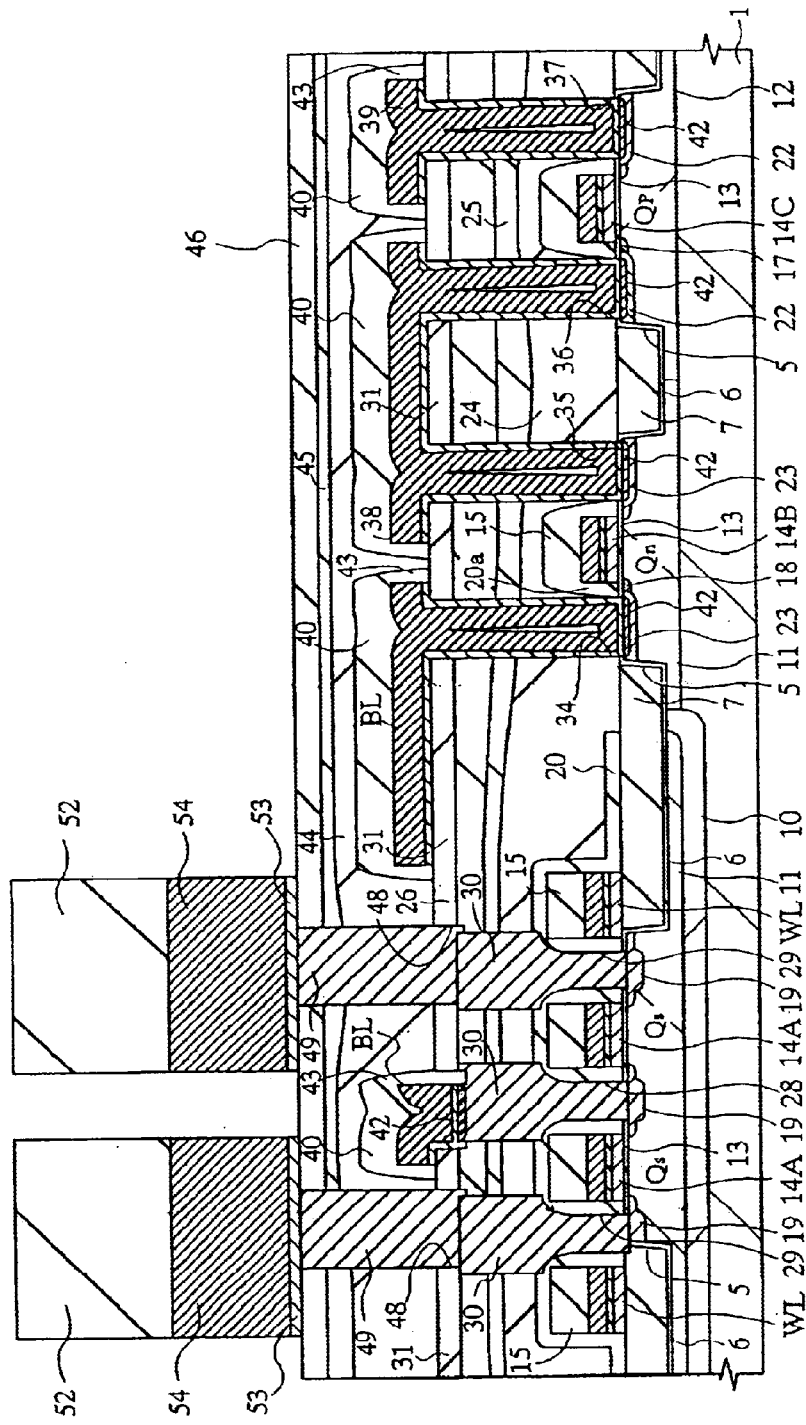
Figure 32:
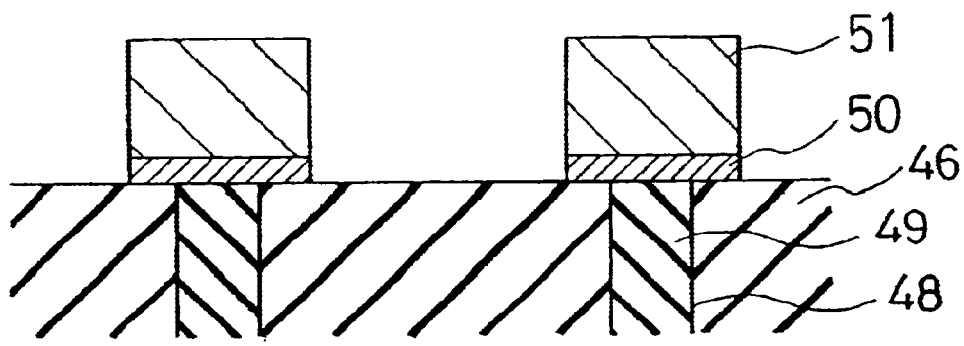
FIGS. 32 through 39 are schematic cross sectional views of the DRAM of Embodiment 3 shown in the order of the steps of manufacturing it.

The method of manufacturing Embodiment 3 is identical with that of manufacturing Embodiment 1 down to the step of FIG. 20. FIG. 32 is a schematic cross sectional view of the region of the information storage capacity element in this step. Referring to FIG. 32, the reaction preventing film 50 and the ruthenium film 51 on the plugs 49 formed in the respective through holes 48 of the silicon oxide film 46 are already processed.

Figure 33:
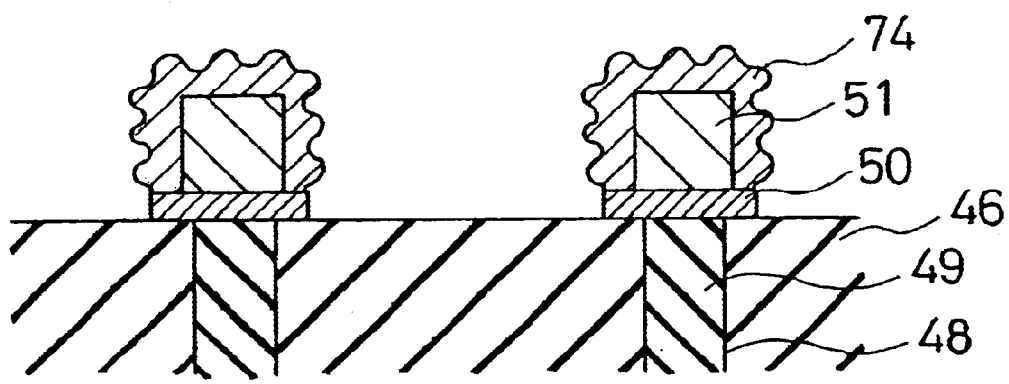

Thereafter, referring to FIG. 33, the ruthenium film 51 is oxidized typically by thermally treating it at 700° C. for 10 minutes in an dinitrogen monoxide ($N_2O$) gas atmosphere to produce a ruthenium oxide film 74 having ruggedness on the surface. The size of the ruggedness of the ruthenium oxide film 74 can be controlled by means of the ratio of nitrogen gas to dinitrogen monoxide ($N_2O$) gas and the heat treatment temperature. Note that the ruthenium oxide film 74 contains the residual ruthenium film 51 in the inside because the latter is not thoroughly oxidized. Also note that the reaction preventing film 50 prevents the plugs 49 from being oxidized.

Figure 34:
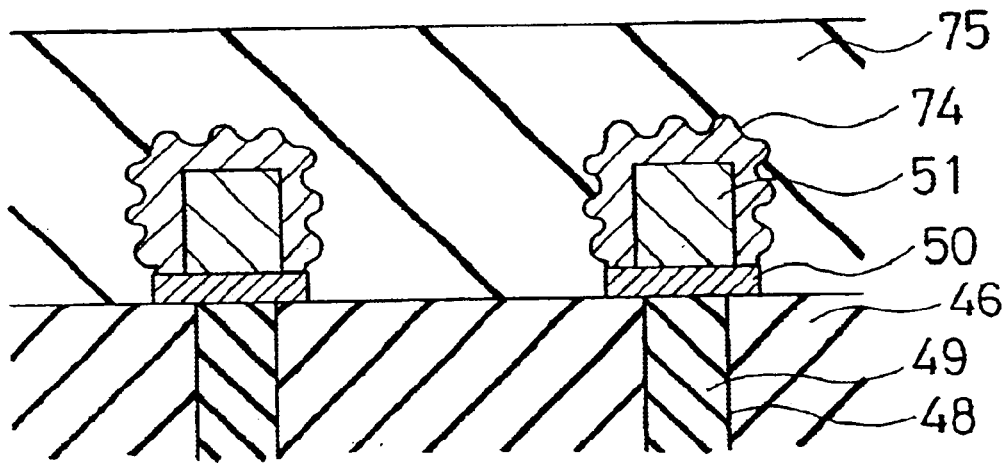

Then, referring to FIG. 34, an SOG film 75 is formed on the entire surface of the semiconductor substrate 1. The produced SOG film 75 is satisfactorily planarized due to its own fluidity.

Figure 35:
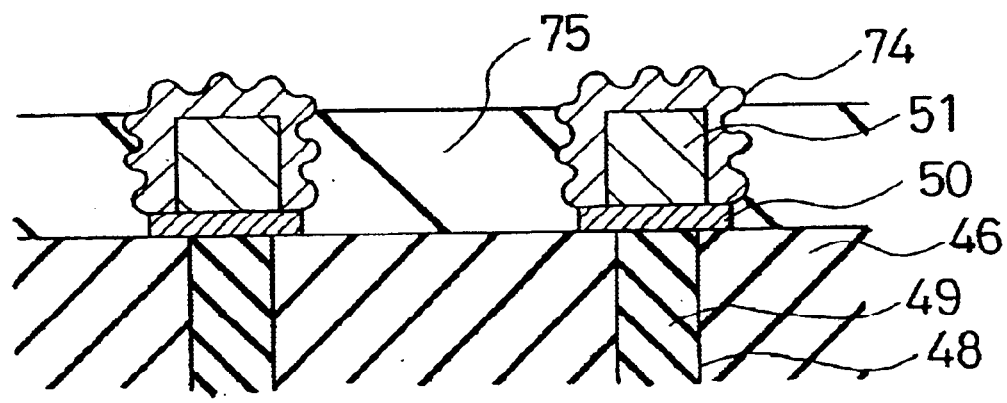

Thereafter, referring to FIG. 35, the SOG film 75 is polished by the CMP method until the surface of the ruthenium oxide film 74 is sufficiently exposed.

Figure 36:
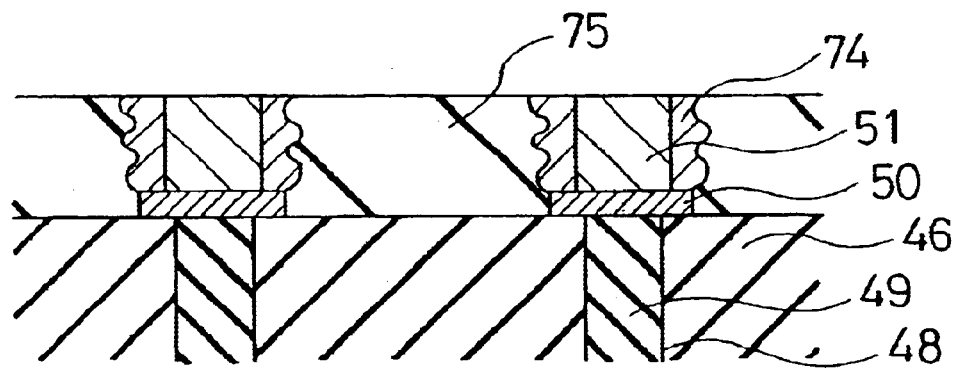

After exposing the ruthenium oxide film 74 on the surface of the substrate, it is further polished by the CMP method until the surface of the ruthenium film 51 contained in the ruthenium oxide film 74 comes to be exposed as shown in FIG. 36.

Figure 37:
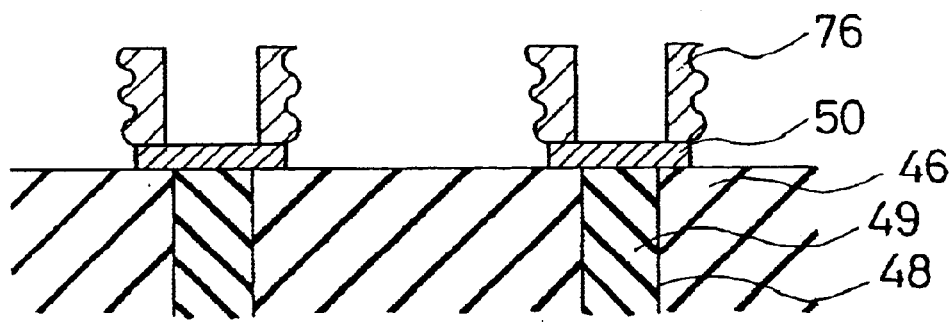

After exposing the surface of the ruthenium film 51, only the ruthenium film 51 is removed as shown in FIG. 37 by selective wet etching. The selective wet etching utilizes the difference of etching rate between the ruthenium film 51 and the ruthenium oxide film 74. As a result, lower electrodes 76 having an upper opening and rugged surface are produced out of the ruthenium oxide film 74.

As described above by referring to Embodiment 1, a metal ruthenium film may be formed selectively on the surface of the lower electrode 76 by the CVD method. Such a metal ruthenium film is oriented in a particular plane bearing so that the temperature of crystallizing the tantalum oxide film can be reduced as in the case of Embodiment 1.

Figure 38:
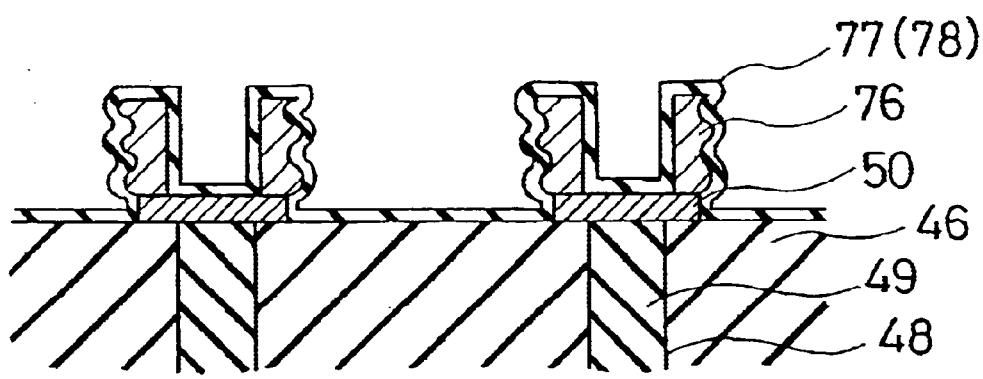

Then, referring to FIG. 38, an about 10 nm thick tantalum oxide film 77 is deposited by the CVD method in a manner as described above in terms of Embodiment 1. It is an amorphous film containing tantalum oxide crystal.

Thereafter, as in Embodiment, the tantalum oxide film 77 is crystallized by means of a heat treatment process conducted at 500° C. in an ozone ($O_3$) gas atmosphere to produce a polycrystalline tantalum oxide film 78.

Figure 39:
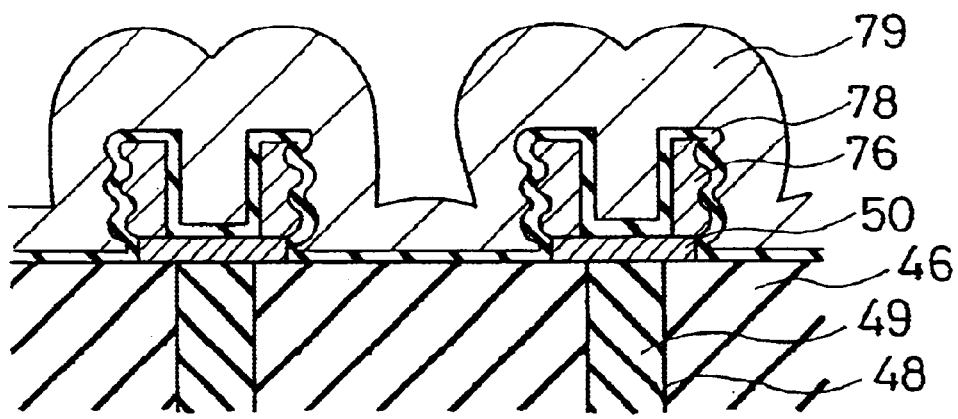

Then, referring to FIG. 39, a ruthenium film 79 is formed by the CVD method to produce upper electrodes. In this way, a complete information storage capacity element C is prepared. All the subsequent steps are same as their counterpart of Embodiment 1.

Thus, with this embodiment, the accumulated electric charge of the information storage capacity element C can be raised because the lower electrodes 76 is realized in the form of a cylinder having an upper opening and the ruthenium film of the lower electrodes 76 have a rugged surface. Additionally, since the tantalum oxide film 77 can be crystallized at low temperature, any possible destruction and/or degradation of the barrier metal layer ($TiSi_2$ layer 42) of the contacts of the bit lines BL and the wires that gives rise to a serious problem in DRAMs having a COB structure can be effectively prevented from occurring.

Embodiment 4

FIGS. 40 through 45 are schematic cross sectional views of the DRAM of Embodiment 4 shown in the order of the steps of manufacturing it. FIGS. 40 through 45 show only the region of the information storage capacity element C because all the other members of the DRAM are identical with their counterparts of Embodiment 1.

Since the DRAM of this fourth embodiment is identical with the first embodiment illustrated in FIGS. 1 and 2 except the region of the information storage capacity element C, only the information storage capacity element C will be described below.

Figure 19:
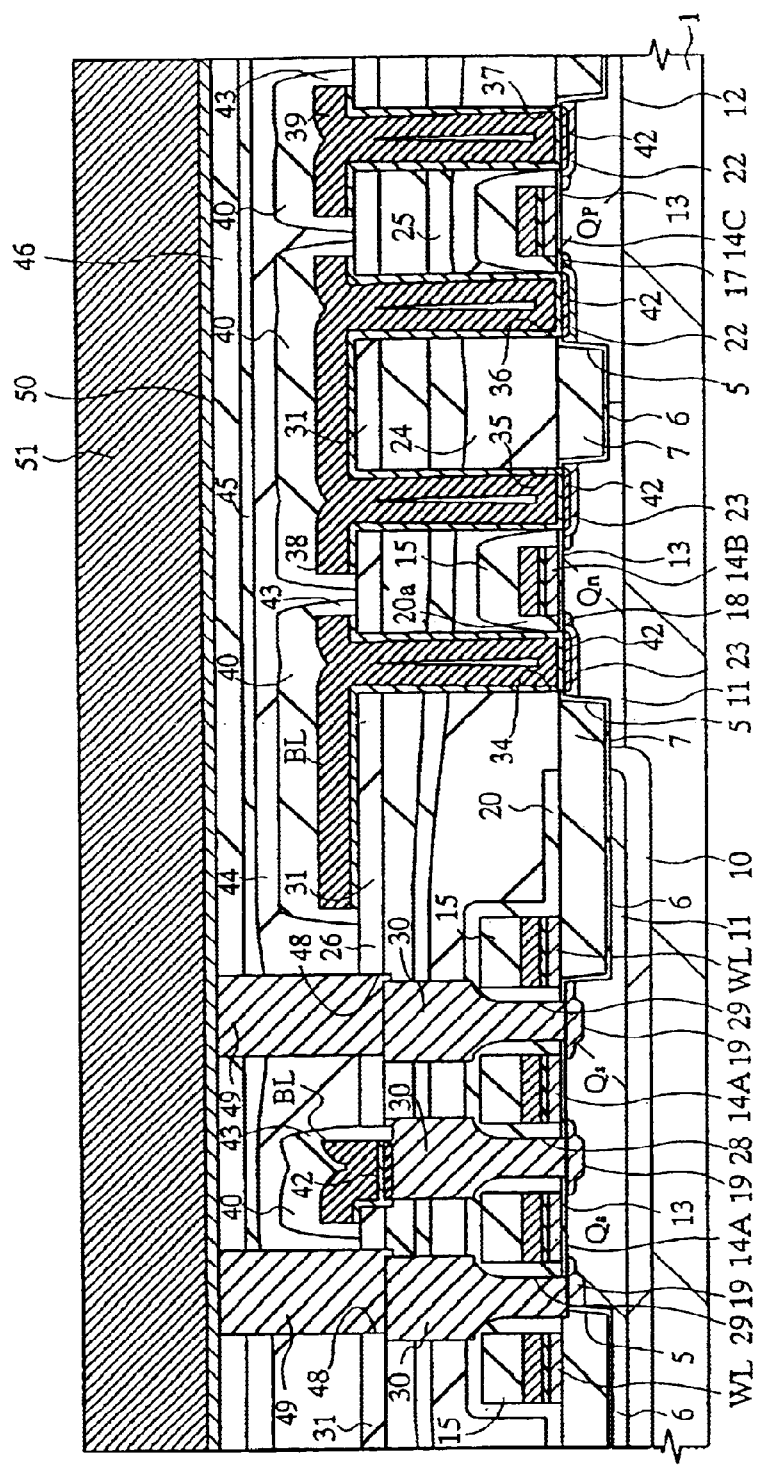

The method of manufacturing Embodiment 4 is identical with that of manufacturing Embodiment 1 down to the step of FIG. 19.

Figure 40:
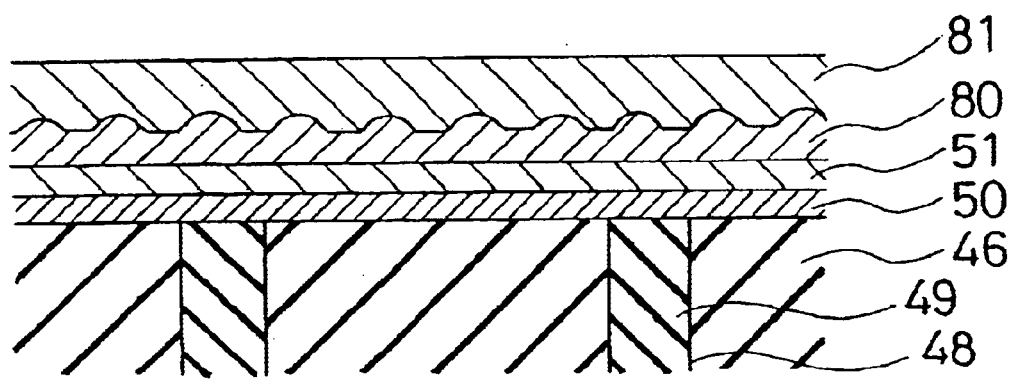
FIGS. 40 through 45 are schematic cross sectional views of the DRAM of Embodiment 4 shown in the order of the steps of manufacturing it.

Then, referring to FIG. 40, the ruthenium film 51 as described above for Embodiment 1 by referring to FIG. 19 is subjected to an $O_2$ plasma processing operation in conditions of 500° C., 200 W and 3 min to provide an active oxygen atmosphere for the process in order to form a ruthenium oxide film 80 having the rugged surface on the ruthenium film 51. Additionally, a second ruthenium film 81 is formed on the surface of the ruthenium oxide film 80. The second ruthenium film 81 can be formed in a manner as described above by referring to Embodiment 1. Note that not all the ruthenium film 51 is oxidized in the oxidizing process but an unreacted part of the ruthenium film 51 is left under the ruthenium oxide film 80.

Figure 41:
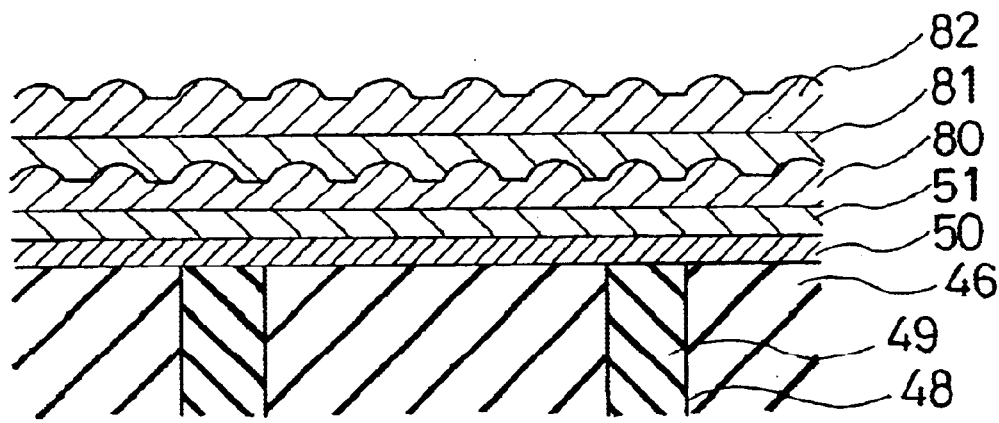

Then, referring to FIG. 41, the second ruthenium film 81 is subjected to an $O_2$ plasma processing operation in conditions of 500° C., 200W and 3 min to provide an active oxygen atmosphere for the process in order to form a ruthenium oxide film 82 having the rugged surface on the ruthenium film 81. Thus, a multilayer film comprising the reaction preventing film 50, the ruthenium film 51, the ruthenium oxide film 80, the ruthenium film 81 and the ruthenium oxide film 82 is produced. Note that the $O_2$ plasma of the above oxidizing atmosphere may be replaced by ozone. It may be needless to say that the film thickness of the ruthenium oxide film 80 and that of the ruthenium oxide film 82 may be regulated by regulating the conditions of said plasma.

Figure 42:
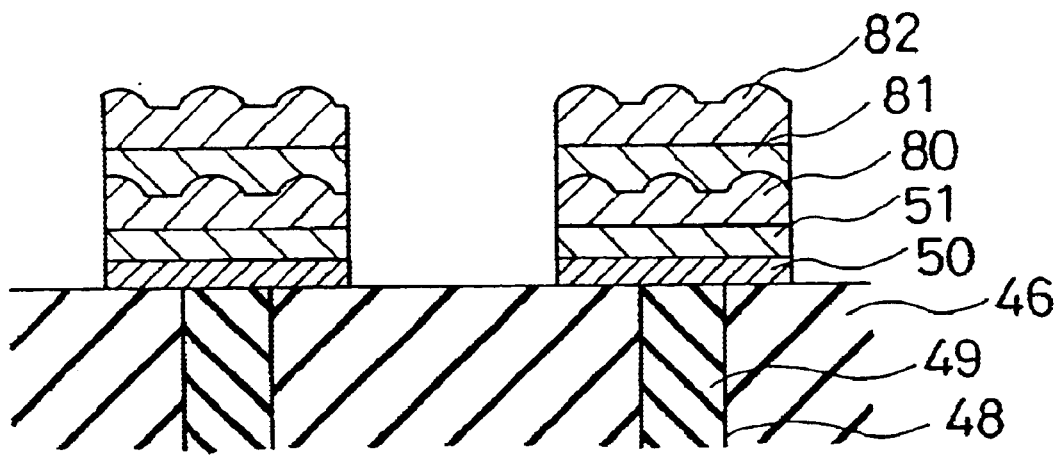

Then, referring to FIG. 42, the multilayer film comprising the reaction preventing film 50, the ruthenium film 51, the ruthenium oxide film 80, the ruthenium film 81 and the ruthenium oxide film is etched by using a photoresist film as a mask.

Figure 43:
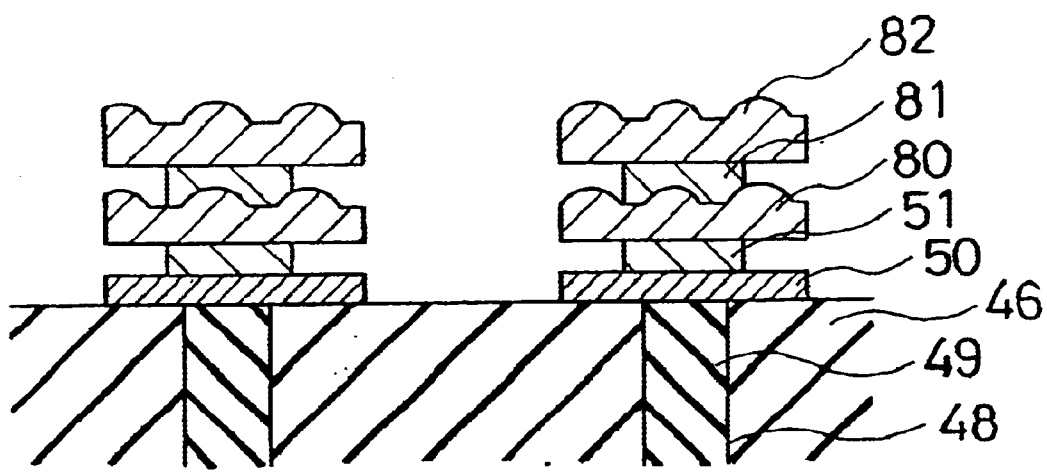

Thus, the multilayer film is subjected to a wet etching process in such a way that the ruthenium films 51 and 81 are partly left as shown in FIG. 43. This wet etching process is conducted in conditions where the ruthenium oxide films 80 and 82 are hardly etched. As a result, fin-shaped lower electrodes carrying the unetched ruthenium films 51, 81 only in a central portion are formed as shown information FIG. 43. Due to the fact that the lower electrodes have a fin-shaped profile and the ruthenium films 80, 82 that are hardly etched have ruggedness on top thereof, the lower electrodes have an increased surface area to consequently increase the accumulated electric charge of the information storage capacity element C.

A metal ruthenium film may be formed on the upper surface of the lower electrodes by CVD as described above by referring to Embodiment 3.

Figure 44:
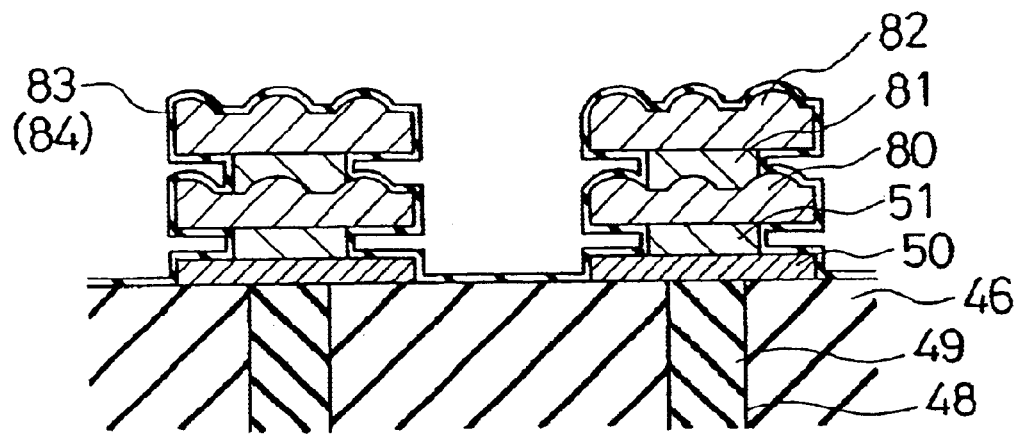

Then, a tantalum oxide film 83 as shown in FIG. 44 is formed just like its counterpart of Embodiment 1. Note that the tantalum oxide film 83 is an amorphous film containing tantalum oxide crystal as in the case of Embodiment 1. Also as described for Embodiment 1, the tantalum oxide film 83 is crystallized by heat treatment to produce a polycrystalline tantalum oxide film 84. As described above for Embodiment 1, the heat treatment can be conducted at low temperature.

Figure 45:
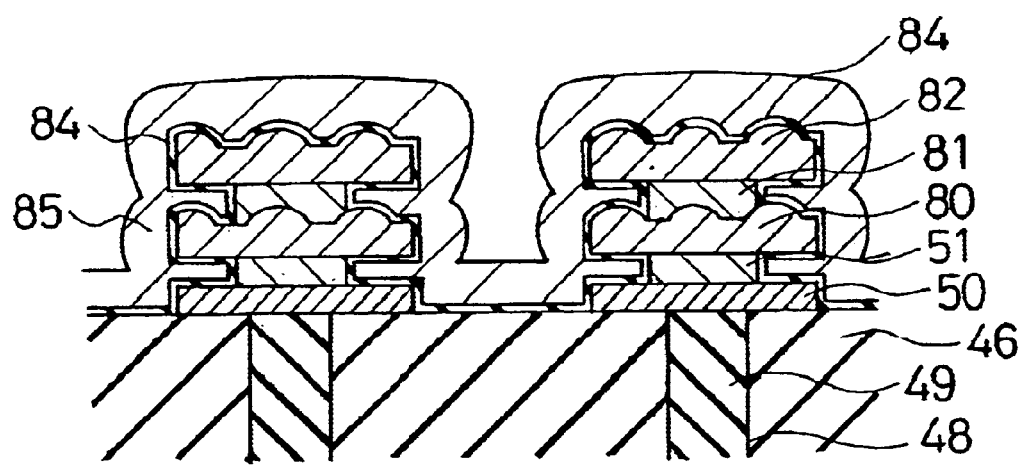

Then, upper electrodes and a ruthenium film 85 are formed by the CVD method as shown in FIG. 45. Note that the upper electrodes may be formed alternatively by using titanium nitride, tungsten or ruthenium oxide.

With this embodiment, since the fin-shaped lower electrodes and the ruthenium oxide films 80, 82 of the lower electrodes have the rugged surface, the effective accumulated electric charge of the information storage capacity element C can be increased. Additionally, since the rugged surface of the ruthenium oxide films 80, 82 can be formed at low temperature by using the oxygen plasma method and the crystallization of the tantalum oxide film 83 can be conducted at low temperature, any possible destruction and/or degradation of the barrier metal layer ($TiSi_2$ layer 42) of the contacts of the bit lines BL and the wires that gives rise to a serious problem in DRAMs having a COB structure can be effectively prevented from occurring.

While the present invention of the inventors is described in detail by way of preferred embodiments, the present invention is by no means limited to those embodiments that may be modified or altered in various different ways without departing from the scope of the present invention.

Figure 46:
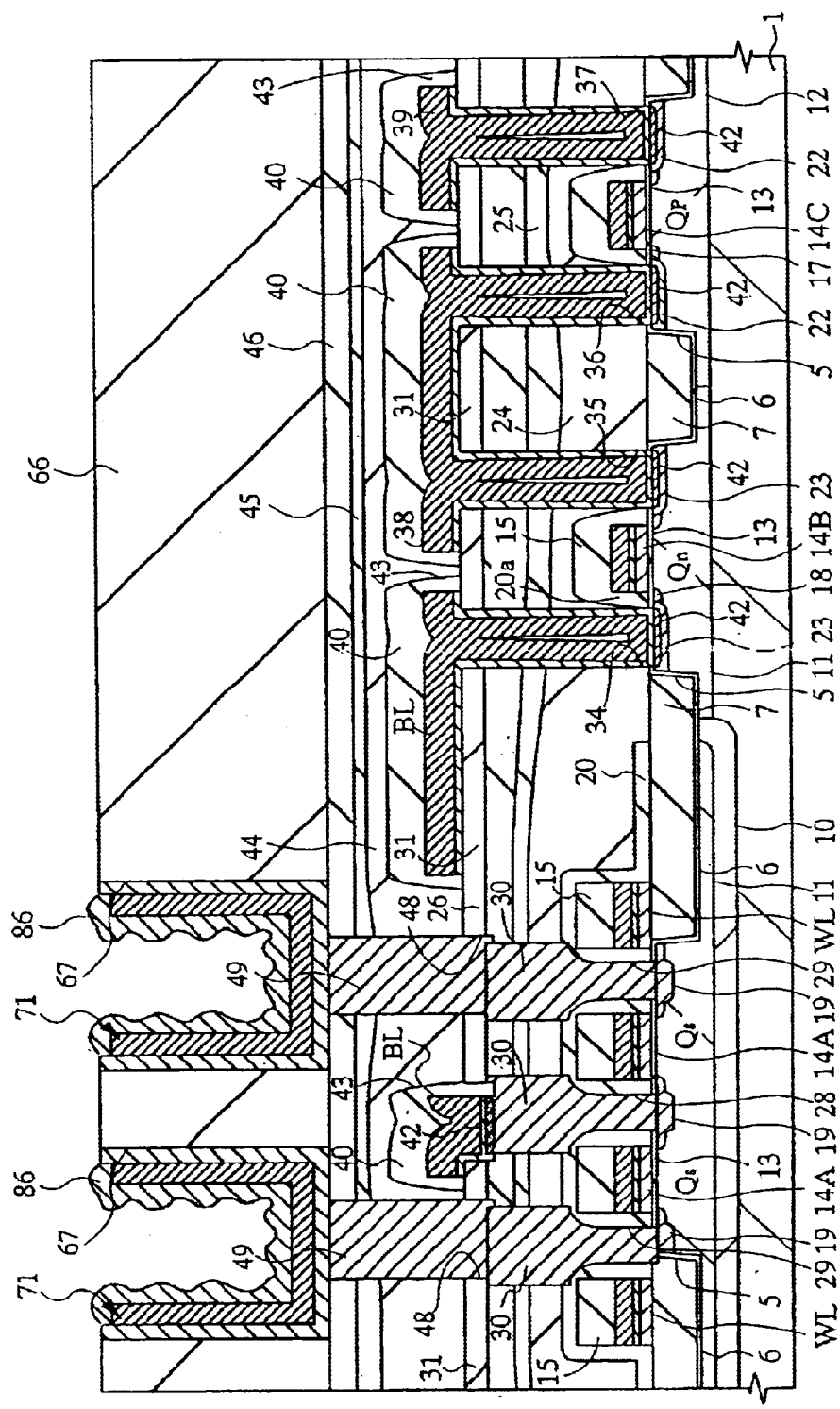
FIG. 46 is a schematic cross sectional view of the DRAM of Embodiment 2 obtained by modifying that of FIGS. 27 through 31, illustrating the method of manufacturing it.

For instance, the surface of the lower electrodes 71 of ruthenium film of embodiment 2 may be subjected to an oxidizing process to produce a ruthenium oxide film 86 as shown in FIG. 46. Then, the ruthenium oxide film 86 shows rugged surface to increase the surface area of the lower electrodes and hence the accumulated electric charge of the information storage capacity element C. The process of oxidizing the surface of the lower electrodes 71 can be conducted in a manner as described above by referring to Embodiments 3 and 4.

INDUSTRIAL APPLICABILITY

As described above in detail, a semiconductor device and a method of manufacturing the same according to the invention can effectively be used to raise the reliability of the information storage capacity element of a DRAM and allows it to realize a high degree of integration. Therefore, the present invention provides a wide scope of applicability.

What is claimed is:

1. A process of manufacturing a semiconductor device, comprising:

(a) forming a first MISFET over a first region of a semiconductor substrate and a second MISFET over a second region of said semiconductor substrate, wherein each of said first and second MISFETs has a gate electrode, and source and drain regions on a main surface of a semiconductor substrate;

(b) forming silicide layers having a metal with high melting point over said source and drain regions of said second MISFET;

(c) forming a first insulating film over said first and second MISFETs;

(d) forming a second insulating film greater than said first insulating film in film thickness over said first insulating film;

(e) forming a through hole in said second insulating film, said through hole located on the first MISFET and exposing said surface of said first insulating film;

(f) forming a first metal film oriented in a (002) plane over inner walls of said through hole and over said surface of said first insulating film in said through hole, (g) depositing a tantalum oxide film over said first metal film;

(h) thermally treating said tantalum oxide film so as to form a polycrystalline dielectric film; and (i) forming a second metal film over the dielectric film.

2. The process of manufacturing a semiconductor device according to claim 1, wherein in said (g) depositing a tantalum oxide film, said tantalum oxide film is deposited by a chemical vapor deposition method using pentaethoxytantalum gas as source gas in a temperature range between 450 and 500° C.

3. The process of manufacturing a semiconductor device according to claim 2, wherein said tantalum oxide film contains a crystal of tantalum oxide in an amorphous tantalum oxide film in an as-deposited condition.

4. The process of manufacturing a semiconductor device according to claim 1, wherein said (h) thermally treating the tantalum oxide film includes one of:

a first condition that temperature in an oxygen ($O_2$) atmosphere is lower than 700° C.;

a second condition that temperature in an ozone ($O_3$) atmosphere is lower than 600° C.;

a third condition that temperature in a nitrogen oxide ($N_2O$) gas atmosphere is between 600 and 650° C.;

a fourth condition that a second treatment, in an atmosphere containing at least ozone, at a temperature less than 600° C., is conducted, after a first treatment in a non-oxidizing atmosphere at a temperature less than 700° C.; and a fifth condition that the first treatment is conducted after the second treatment.

5. The process of manufacturing a semiconductor device according to claim 4, wherein said tantalum oxide film is oriented in a (002) plane.

6. The process of manufacturing a semiconductor device according to claim 1, wherein said first metal film is made of ruthenium.

7. The process of manufacturing a semiconductor device according to claim 1, wherein said second metal film is made of ruthenium.

8. A process of manufacturing a semiconductor device, comprising:

(a) forming a first MISFET over a first region of a semiconductor substrate and a second MISFET over a second region of said semiconductor substrate, wherein each of said first and second MISFETs has a gate electrode, and source and drain regions on a main surface of a semiconductor substrate;

(b) forming silicide layers having a metal with high melting point over said source and drain regions of said second MISFET;

(c) forming a first insulating film over said first and second MISFETs;

(d) forming a first metal film oriented in a (002) plane over said first insulating film;

(e) depositing a tantalum oxide film over said first metal film;

(f) thermally treating said tantalum oxide film so as to form a polycrystalline dielectric film; and (g) forming a second metal film over said dielectric film.

9. The process of manufacturing a semiconductor device, according to claim 8, wherein in said (e) depositing a tantalum oxide film, said tantalum oxide film is deposited by a chemical vapor deposition method using pentaethoxytantalum gas as source gas in a temperature range between 450 and 500° C.

10. The process of manufacturing a semiconductor device according to claim 9, wherein said tantalum oxide film contains a crystal of tantalum oxide in an amorphous tantalum oxide film in an as-deposited condition.

11. The process of manufacturing a semiconductor device according to claim 8, wherein said (f) thermally treating said tantalum oxide film includes one of:

a first condition that temperature in an oxygen ($O_2$) atmosphere is lower than 700° C.;

a second condition that temperature in an ozone ($O_3$) atmosphere is lower than 600° C.;

a third condition that temperature in a nitrogen oxide ($N_2O$) gas atmosphere is between 600 and 650° C.;

a fourth condition that a second treatment in an atmosphere containing at least ozone, at a temperature less than 600° C., is conducted, after a first treatment in a non-oxidizing atmosphere at a temperature less than 700° C.; and a fifth condition that the first treatment is conducted after the second treatment.

12. The process of manufacturing a semiconductor device according to claim 11, wherein said tantalum oxide film is oriented in a (002) plane.

13. The process of manufacturing a semiconductor device according to claim 8, wherein said first metal film is made of ruthenium.

14. The process of manufacturing a semiconductor device according to claim 8, wherein said second metal film is made of ruthenium.

15. A process of manufacturing a semiconductor device, comprising:

(a) forming a first MISFET over a first region of a semiconductor substrate and a second MISFET over a second region of said semiconductor substrate, wherein each of said first and second MISFETs has a gate electrode, and source and drain regions on a main surface of a semiconductor substrate;

(b) forming a first insulating film over said first and second MISFETs;

(c) forming a connection hole for connecting distributing wires formed over said first insulating film, to said source and drain regions of said second MISFET;

(d) depositing a plurality of conductive films into said connection hole;

(e) thermally treating said plurality of conductive films for forming silicide layers over surfaces of said source and drain regions of said second MISFET;

(f) forming a second insulating film over said first insulating film in order to cover said wires;

(g) forming a third insulating film greater than said second insulating film in film thickness over said first or second insulating film;

(h) forming a hole in said third insulating film, said hole located on the first MISFET and exposing the surface of said second insulating film;

(i) forming a first metal film oriented in a (002) plane over inner walls of said hole and over said surface of said second insulating film in said hole;

(j) depositing a tantalum oxide film over said first metal film;

(k) thermally treating said tantalum oxide film so as to form a polycrystalline dielectric film; and (l) forming a second metal film over the dielectric film.

16. The process of manufacturing a semiconductor device according to claim 15, wherein in said (j) depositing a tantalum oxide film, said tantalum oxide film is deposited by a chemical vapor deposition method using pentaethoxytantalum gas as source gas in a temperature range between 450 and 500° C.

17. The process of manufacturing a semiconductor device according to claim 16, wherein said tantalum oxide film contains a crystal of tantalum oxide in an amorphous tantalum oxide film in an as-deposited condition.

18. The process of manufacturing a semiconductor device according to claim 15, wherein said (k) thermally treating said tantalum oxide film includes one of:

a first condition that temperature in an oxygen ($O_2$) atmosphere is lower than 700° C.;

a second condition that temperature in an ozone ($O_3$) atmosphere is lower than 600° C.;

a third condition that temperature in a nitrogen oxide ($N_2O$) gas atmosphere is between 600 and 650° C.;

a fourth condition that a second treatment in an atmosphere containing at least ozone, at a temperature less than 600° C., is conducted, after a first treatment in an non-oxidizing atmosphere at a temperature less than 700° C.; and a fifth condition that the first treatment is conducted after the second treatment.

19. The process of manufacturing a semiconductor device according to claim 18, wherein said tantalum oxide film is oriented in a (002) plane.

20. The process of manufacturing a semiconductor device according to claim 15, wherein said first metal film is made of ruthenium.

21. The process of manufacturing a semiconductor device according to claim 15, wherein said second metal film is made of ruthenium.

22. A process of manufacturing a semiconductor device, comprising:

(a) forming a first MISFET over a first region of a semiconductor substrate and a second MISFET over a second region of said semiconductor substrate, wherein each of said first and second MISFETs has a gate electrode, and source and drain regions on a main surface of a semiconductor substrate;

(b) forming a first insulating film over said first and second MISFETs;

(c) forming a connection hole for connecting distributing wires formed over said first insulating film, to said source and drain regions of said second MISFET;

(d) depositing a plurality of conductive films into said connection hole;

(e) thermally treating said plurality of conductive films for forming silicide layers over surfaces of said source and drain regions of said second MISFET;

(f) forming a second insulating film greater than said first insulating film in film thickness over said first insulating film, in order to cover said wires;

(g) forming a first metal film oriented in a (002) plane over said second insulating film;

(h) depositing a tantalum oxide film over said first metal film;

(i) thermally treating said tantalum oxide film so as to form a polycrystalline dielectric film; and (j) forming a second metal film over said dielectric film.

23. The process of manufacturing a semiconductor device according to claim 22, wherein in said (h) depositing a tantalum oxide film, said tantalum oxide film is deposited by a chemical vapor deposition method using pentaethoxytantalum gas as source gas in a temperature range between 450 and 500° C.

24. The process of manufacturing a semiconductor device according to claim 23, wherein said tantalum oxide film contains a crystal of tantalum oxide in an amorphous tantalum oxide film in an as-deposited condition.

25. The process of manufacturing a semiconductor device according to claim 22, wherein said (i) thermally treating said tantalum oxide film includes one of:

a first condition that temperature in an oxygen ($O_2$) atmosphere is lower than 700° C.;

a second condition that temperature in an ozone ($O_3$) atmosphere is lower than 600° C.;

a third condition that temperature in a nitrogen oxide ($N_2O$) gas atmosphere is between 600 and 650° C.;

a fourth condition that a second treatment in an atmosphere containing at least ozone at a temperature less than 600° C. is conducted, after a first treatment in a non-oxidizing atmosphere at a temperature less than 700° C.; and a fifth condition that the first treatment is conducted after the second treatment.

26. The process of manufacturing a semiconductor device according to claim 25, wherein said tantalum oxide film is oriented in a (002) plane.

27. The process of manufacturing a semiconductor device according to claim 22, wherein said first metal film is made of ruthenium.

28. The process of manufacturing a semiconductor device according to claim 22, wherein said second metal film is made of ruthenium.

* * * * *